(12) United States Patent
Miyata et al.

(10) Patent No.: US 11,539,182 B2
(45) Date of Patent: Dec. 27, 2022

(54) LIGHT SOURCE DEVICE AND METHOD OF MANUFACTURING THE SAME

(71) Applicant: NICHIA CORPORATION, Anan (JP)

(72) Inventors: Tadaaki Miyata, Yokohama (JP); Yoshihiro Kimura, Yokohama (JP)

(73) Assignee: NICHIA CORPORATION, Anan (JP)

( * ) Notice: Subject to any disclaimer, the term of this patent is extended or adjusted under 35 U.S.C. 154(b) by 238 days.

(21) Appl. No.: 17/021,855

(22) Filed: Sep. 15, 2020

(65) Prior Publication Data

US 2021/0091532 A1     Mar. 25, 2021

(30) Foreign Application Priority Data

Sep. 20, 2019 (JP) .............................. JP2019-171454
Dec. 24, 2019 (JP) .............................. JP2019-232870

(51) Int. Cl.
    *H01S 5/02257*    (2021.01)
    *C03C 4/00*       (2006.01)
    *C03C 27/06*      (2006.01)
    *H01S 5/02216*    (2021.01)

(52) U.S. Cl.
    CPC ........ *H01S 5/02257* (2021.01); *C03C 4/0071* (2013.01); *C03C 27/06* (2013.01); *H01S 5/02216* (2013.01); *C03C 2204/00* (2013.01)

(58) Field of Classification Search
    CPC .................................................. H01S 5/06236
    USPC ................................................... 372/44.01
    See application file for complete search history.

(56) References Cited

U.S. PATENT DOCUMENTS

| | | | |
|---|---|---|---|
| 5,981,945 A | * | 11/1999 | Spaeth ................ G02B 6/4204 257/E31.127 |
| 6,351,027 B1 | | 2/2002 | Giboney et al. |
| 2005/0047462 A1 | | 3/2005 | Shimada |
| 2009/0072380 A1 | | 3/2009 | Tarn |
| 2009/0219728 A1 | | 9/2009 | Hata et al. |
| 2009/0225797 A1 | | 9/2009 | Kuhnelt et al. |
| 2010/0230697 A1 | | 9/2010 | Kohler et al. |
| 2010/0258713 A1 | | 10/2010 | Takahashi et al. |
| 2014/0226689 A1 | * | 8/2014 | Takeda ................. H01S 5/0087 372/43.01 |
| 2017/0148955 A1 | | 5/2017 | Wu |
| 2017/0279019 A1 | | 9/2017 | Ueda et al. |
| 2018/0287334 A1 | | 10/2018 | Miyata et al. |
| 2018/0337165 A1 | * | 11/2018 | Migita ................... H01L 33/58 |
| 2018/0366903 A1 | | 12/2018 | Miyata et al. |

(Continued)

FOREIGN PATENT DOCUMENTS

DE    10 2018 102 961 A1    8/2019
EP         1 130 646 A1     9/2001

(Continued)

*Primary Examiner* — Tuan N Nguyen
(74) *Attorney, Agent, or Firm* — Foley & Lardner LLP

(57) ABSTRACT

A light source device includes: a laser diode; a substrate directly or indirectly supporting the laser diode; and a cap secured to the substrate and covering the laser diode. The cap includes a first glass portion configured to transmit laser light that is emitted from the laser diode, and a second glass portion. At least one of the first glass portion and the second glass portion includes an alkaline glass region.
The first glass portion and the second glass portion are bonded together via an electrically conductive layer that is in contact with the alkaline glass region.

20 Claims, 21 Drawing Sheets

(56) References Cited

U.S. PATENT DOCUMENTS

| | | | | |
|---|---|---|---|---|
| 2019/0035700 A1* | 1/2019 | Murayama | .......... | H01S 5/02208 |
| 2019/0097381 A1* | 3/2019 | Miyata | .................. | H01S 5/0233 |
| 2020/0144785 A1 | 5/2020 | Neumann et al. | | |

FOREIGN PATENT DOCUMENTS

| | | |
|---|---|---|
| JP | 2004-311861 A | 11/2004 |
| JP | 2005-072448 A | 3/2005 |
| JP | 2006-013699 A | 1/2006 |
| JP | 2007-281061 A | 10/2007 |
| JP | 2007-528591 A | 10/2007 |
| JP | 2008-022001 A | 1/2008 |
| JP | 2008-508698 A | 3/2008 |
| JP | 2009-021381 A | 1/2009 |
| JP | 2010-537411 A | 12/2010 |
| JP | 2015-170783 A | 9/2015 |
| JP | 2015-220330 A | 12/2015 |
| JP | 2016-207683 A | 12/2016 |
| JP | 2018-006693 A | 1/2018 |
| JP | 2018-170310 A | 11/2018 |
| JP | 2018-194423 A | 12/2018 |
| JP | 2019-004025 A | 1/2019 |
| JP | 2019-033125 A | 2/2019 |
| JP | 2019-067809 A | 4/2019 |
| JP | 2020-520115 A | 7/2020 |
| WO | WO-2015/174127 A1 | 11/2015 |
| WO | WO-2016/103547 A1 | 6/2016 |
| WO | WO-2017/149573 A1 | 9/2017 |
| WO | WO-2018/206717 A1 | 11/2018 |
| WO | WO-2019/154465 A1 | 8/2019 |
| WO | WO-2019/179769 A1 | 9/2019 |
| WO | WO-2020/104233 A1 | 5/2020 |

\* cited by examiner

LIGHT SOURCE DEVICE AND METHOD OF MANUFACTURING THE SAME

CROSS-REFERENCE TO RELATED APPLICATIONS

This application claims priority to Japanese Patent Application No. 2019-171454, filed on Sep. 20, 2019, and Japanese Patent Application No. 2019-232870, filed on Dec. 24, 2019, the entire contents of which are hereby incorporated by reference.

BACKGROUND

The present disclosure relates to a light source device that includes a laser diode, and to a method of manufacturing the same.

Applications for light source devices that include a laser diode as a light-emitting device are expanding into various fields. For example, display devices (so-called near-eye displays) having a display section at a position near the eyes of a user, e.g., head-mounted displays (HMD), are under development.

A light source device described in PCT Publication No. WO 2017/149573 has a structure in which a glass cap having a substantially rectangular-parallelepiped outer shape covers a laser diode on a substrate.

SUMMARY

In the light source device described in PCT Publication No. WO 2017/149573, flatness of a light-transmitting portion of the glass cap may deteriorate.

The present disclosure provides a light source device in which a light-transmitting portion of a glass cap can attain improved flatness, and a method of manufacturing the same.

A light source device according to one embodiment of the present disclosure includes: a laser diode; a substrate directly or indirectly supporting the laser diode; and a cap secured to the substrate and covering the laser diode. The cap includes a first glass portion configured to transmit laser light that is emitted from the laser diode, and a second glass portion. At least one of the first glass portion and the second glass portion includes an alkaline glass region. The first glass portion and the second glass portion are bonded together via an electrically conductive layer that is in contact with the alkaline glass region.

A method of manufacturing a light source device according to one embodiment of the present disclosure includes: providing a substrate directly or indirectly supporting a laser diode; providing a cap, the cap including a first portion configured to transmit laser light that is emitted from the laser diode and a second portion, at least one of the first portion and the second portion including an alkaline glass region, and the first portion and the second portion being bonded together via an electrically conductive layer disposed in contact with the alkaline glass region; and covering the laser diode with the cap and securing the cap to the substrate.

According to certain embodiments of the present disclosure, a light source device in which a light-transmitting portion of a glass cap can attain improved flatness can be provided.

DETAILED DESCRIPTION

Figure 1A:
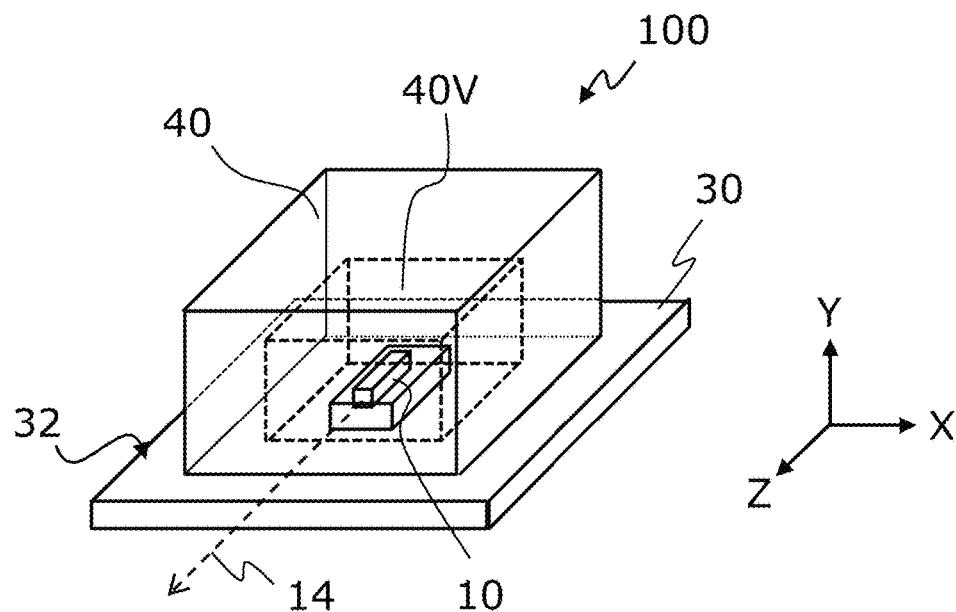
FIG. 1A is a perspective view schematically showing an example structure of a light source device according to one embodiment of the present disclosure.
Figure 1B:
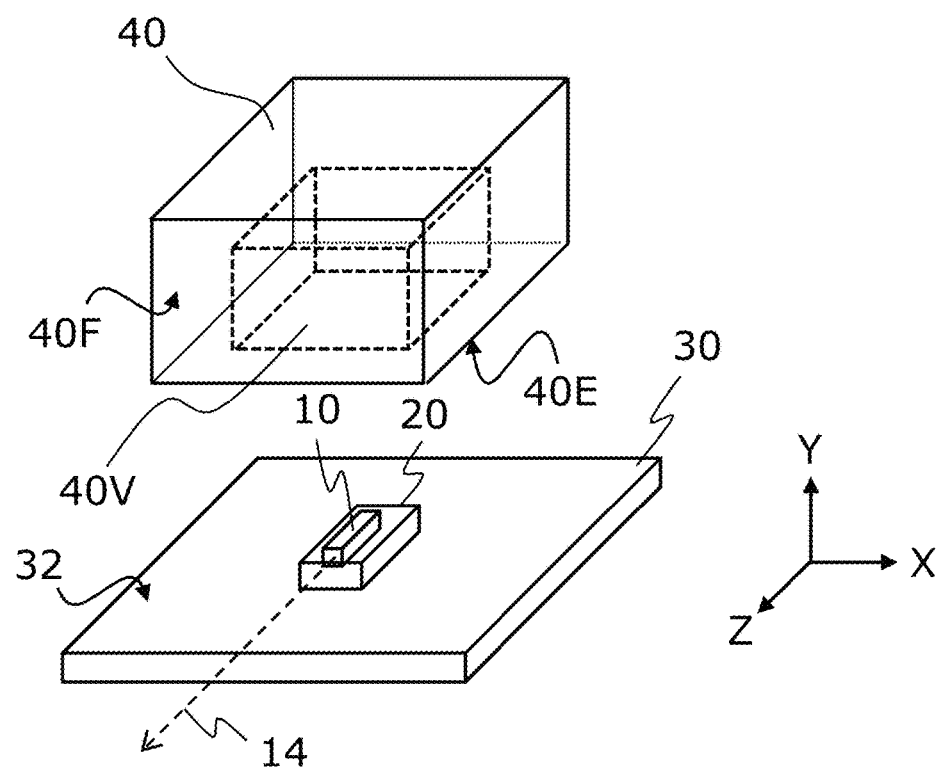
FIG. 1B is a perspective view schematically showing an example structure of a light source device according to one embodiment in manufacturing thereof.

With reference to FIG. 1A and FIG. 1B, a configuration of a light source device according to one embodiment of the present disclosure will be described. FIG. 1A is a perspective view schematically showing an example structure of a light source device 100 according to the present embodiment. FIG. 1B is a perspective view schematically showing an example structure of the light source device 100 in manufacturing thereof. In the figures, the X axis, the Y axis, and the Z axis, which are orthogonal to one another, are shown for reference sake.

The illustrated light source device 100 includes a laser diode 10, a substrate 30 directly or indirectly supporting the laser diode 10, and a cap 40 that is fixed to the substrate 30 and covers the laser diode 10.

The cap 40 defines a recess 40V for accommodating the laser diode 10. When the cap 40 is not fixed to the substrate 30, the recess 40V opens downward, as shown in FIG. 1B. A frontal portion 40F of the cap 40 is light-transmissive to transmit laser light 14 that is radiated from the laser diode 10. A surface of the frontal portion 40F facing the laser diode 10 (i.e., at an inner side) is flat, and may exemplarily be smooth. An antireflection coating may be disposed on an outer surface and/or an inner surface of the frontal portion 40F. The cap 40 has a lower end surface 40E that is bonded to a principal surface 32 of the substrate 30. The lower end surface 40E is located surrounding the opening of the recess 40V. Although the recess 40V has a rectangular parallelepiped shape in the example shown in drawings, the recess 40V may have a shape other than a rectangular parallelepiped shape. The configuration of the cap 40 and a method of producing the same will be described below in detail.

Examples of the laser diode 10 include a laser diode that radiates blue light, a laser diode that radiates green light, and a laser diode that radiates red light. A laser diode that radiates other light may be employed.

In the present specification, blue light refers to light having an emission peak wavelength in a range of 420 nm to 494 nm. Green light refers to light having an emission peak wavelength in a range of 495 nm to 570 nm. Red light refers to light having an emission peak wavelength in a range of 605 nm to 750 nm.

Examples of laser diodes that emit blue light or laser diodes that emit green light include laser diodes containing a nitride semiconductor. Examples of a nitride semiconductor include GaN, InGaN, and AlGaN. Examples of laser diodes that emit red light include laser diodes containing an InAlGaP-based or GaInP-based semiconductor, a GaAs-based or AlGaAs-based semiconductor, etc.

Laser light 14 radiated from the laser diode 10 is divergent, and creates a far field pattern (hereinafter abbreviated as "FFP") of an elliptical shape at a surface that is parallel to an emission end surface through which the laser light 14 is emitted. The FFP is determined by an optical intensity distribution of the laser light 14 at a position apart from the emission end surface. In this optical intensity distribution, a portion having an intensity that is $1/e^2$ or greater with respect to the peak intensity value may be referred to as a "beam cross section."

While an edge-emission type laser diode having an end surface through which the laser light 14 is emitted is employed for the laser diode 10 in the present embodiment, a surface emitting type laser diode (VCSEL) may be employed for the laser diode 10. For simplicity, a center axis of the laser light 14 is indicated with a broken line in the drawing. The actual laser light 14, as described above, diverges and spreads out after being emitted through the end surface 12 of the laser diode 10. Therefore, the laser light 14 may be collimated or converged by an optical system including a lens or lenses, which are not shown. Such an optical system may be provided outside of the light source device 100. At least a portion of the optical system including lenses for collimation or convergence may be provided on the cap 40, or disposed within the recess 40V of the cap 40.

The center axis of the laser light 14 extends in a direction along the principal surface 32 of the substrate 30 (i.e., the Z axis direction). Laser light 14 emitted from the light source device 100 to the outside may be reflected in a direction e.g. perpendicular to the principal surface 32 of the substrate 30 by a mirror disposed outside the light source device 100.

In the example shown in drawings, the laser diode 10 is mounted on the principal surface 32 of the substrate 30 in a state of being secured on a submount 20. Without utilizing the submount 20, the laser diode 10 may be directly bonded to the principal surface 32 of the substrate 30 instead. In these drawings, a wiring for connecting the laser diode 10 to an external circuit is omitted from illustration.

A ceramic may be used for a main material of the substrate 30. For the substrate 30, a material other than a ceramic may be used, and a metal may be used. Examples of a main material of the substrate 30 include ceramics such as aluminum nitride, silicon nitride, aluminum oxide, and carbon nitride; metals such as copper, aluminum, iron; and composites such as copper molybdenum, copper-diamond composite materials, and copper tungsten.

A plurality of metal layers may be disposed on each of an upper surface and a lower surface of the substrate 30. A metal may be disposed to extend inside the substrate 30, which allows metal layers on the upper surface to be electrically connected to metal layers on the lower surface. On the lower surface of the substrate 30, metal layers that are not electrically connected to the metal layers on the upper surface may be disposed. Examples of the substrate 30 include a multilayered ceramic substrate that includes interconnects on the inside and/or the outside.

The submount 20 has a lower surface, an upper surface, and lateral surfaces, and may exemplarily have a rectangular-parallelepiped shape. The submount 20 may be made of a silicon nitride, an aluminum nitride, or a carbon nitride, for example. Metal layers for connecting the laser diode 10 to interconnects on the substrate 30 may be disposed on the upper surface of the submount 20.

The cap 40 is secured to the substrate 30 to cover the laser diode 10 supported by the substrate 30. In the example in drawings, the lower end surface 40E of the cap 40 is bonded to the principal surface 32 of the substrate 30. Such bonding may be achieved via a layer of inorganic material (e.g. a metal) or organic material. Thus, the laser diode 10 may be sealed airtight. The light source device 100 depicted in FIG. 1A may be referred to as a "semiconductor laser package." While the example shown in drawings illustrates a configuration in which a single light source device 100 includes a single laser diode 10, other configurations may be employed in embodiments of the present disclosure. A plurality of laser diodes 10 may be arranged inside a single recess 40V of the cap 40. The plurality of laser diodes 10 may be disposed parallel to one another, so as to emit the laser light 14 in an identical direction.

Figure 2:
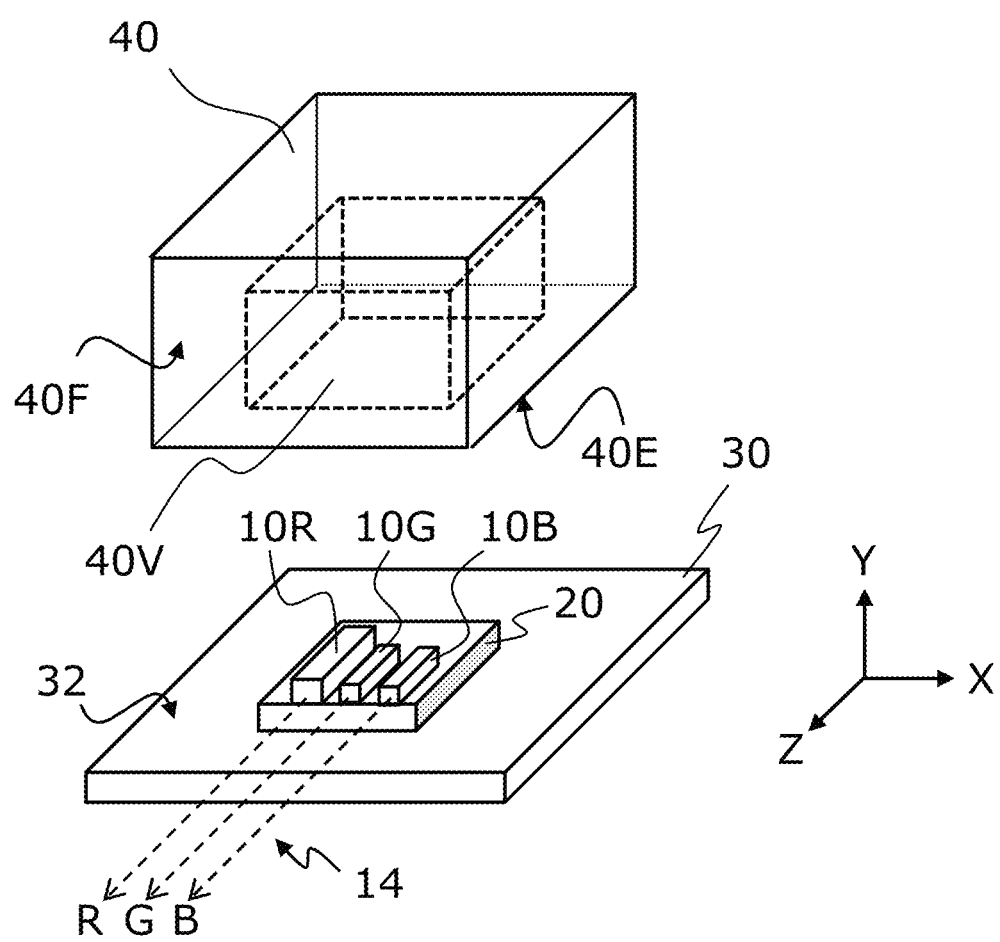
FIG. 2 is a perspective view schematically showing another example of a light source device according to one embodiment of the present disclosure.

FIG. 2 is a perspective view schematically showing another example of a light source device according to one embodiment of the present disclosure. In this example, the substrate 30 includes three laser diodes 10R, 10G and 10B that are arranged on a single submount 20. The laser diodes 10R, 10G and 10B respectively radiate laser light 14 of red, green, and blue colors. The laser diodes 10R, 10G and 10B may be housed inside the single cap 40 and sealed airtight. Two or more submounts 20 may be employed, and the submounts 20 are provided separately for respective ones of the laser diodes 10R, 10G and 10B.

The laser light 14 radiated from each of the laser diodes 10R 10G and 10B may be combined into a coaxial beam by a beam combiner not shown. The laser diodes 10R, 10G and 10B may radiate the laser light 14 with respectively different timings, or all simultaneously. Emission of the laser light 14 is controlled by a driving circuit not shown.

During operation of the light source device 100, the laser light 14 emitted from the laser diode 10 is transmitted through the frontal portion 40F of the cap 40. An antireflection coating may be disposed on an outer side and/or an inner side of the frontal portion 40F. Portions of the cap 40 other than the frontal portion 40F do not need to be light-transmissive.

Figure 3A:
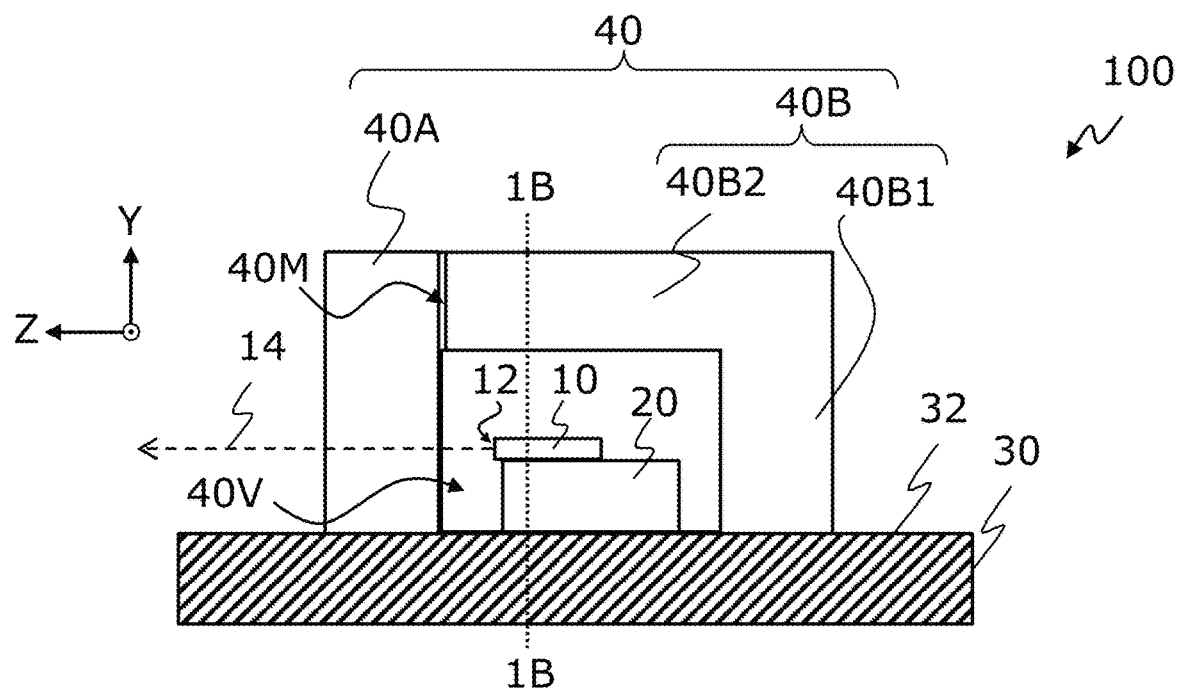
FIG. 3A is a cross-sectional view of a light source device according to one embodiment as taken parallel to the YZ plane.
Figure 3B:
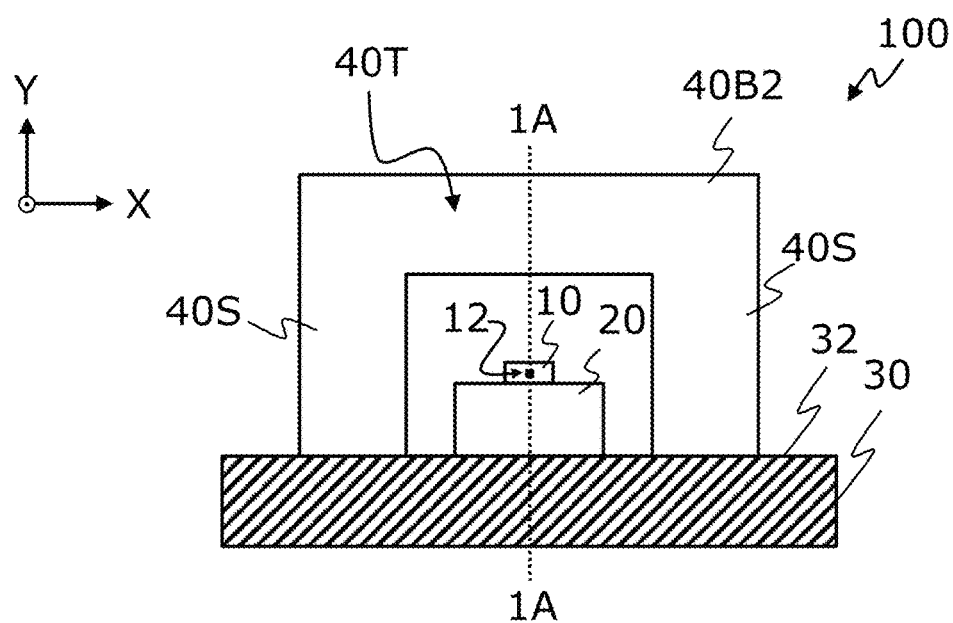
FIG. 3B is a cross-sectional view of a light source device according to one embodiment as taken parallel to the XY plane.

Hereinafter, with reference to FIG. 3A and FIG. 3B, an example structure of the cap 40 according to the present embodiment will be described in detail. FIG. 3A is a diagram schematically showing a cross section parallel to the YZ plane, the cross section containing the center axis of the laser light 14. FIG. 3B is a cross-sectional view taken along line 1B-1B in FIG. 3A, showing a cross section that is parallel to the XY plane. FIG. 3A corresponds to a cross-sectional view along line 1A-1A in FIG. 3B.

The cap 40 in the present embodiment includes a plate-like first portion (first glass portion) 40A that transmits laser light 14 emitted from the laser diode 10, and a second portion (second glass portion) 40B that is made of a different material from the first glass portion 40A. The first glass portion 40A is disposed to intersect with a path of the laser light 14 on the substrate 30 and is bonded to the substrate 30. As shown in FIG. 3A, the second glass portion 40B includes a plate-like portion 40B1, which is disposed parallel to the first glass portion 40A, and a portion 40B2 having a cross section of a shape of the alphabetical letter "C" as shown in FIG. 3B, such that the portions 40B1 and 40B2 are continuous and monolithically formed with each other. As shown in FIG. 3B, the portion 40B2 of the second glass portion 40B having the "C" cross section includes: a pair of lateral wall portions 40S that are located at a lateral side of the laser diode 10; and a cover portion 40T that is located above the laser diode 10 and connects the pair of lateral wall portions 40S together. Thus, the second glass portion 40B has a shape defining the recess 40V.

At least one of the first glass portion 40A and the second glass portion 40B is made of an alkaline glass. An "alkaline glass" as used herein is a silicate compound glass that contains movable ions of alkali metal elements such as $Na^+$, $Ka^+$, and/or $Li^+$. A silicate compound glass containing an alkaline oxide at a concentration of 0.1 mass % or less is referred to as a "non-alkaline glass." Examples of silicate compound glasses include silicate glass, borosilicate glass, and quartz glass.

The first glass portion 40A and the second glass portion 40B are bonded together via an electrically conductive layer 40M. In one embodiment, the first glass portion 40A is an alkaline glass that is anodically bonded to an electrically conductive layer 40M that is disposed on the surface of the second glass portion 40B. The electrically conductive layer 40M may be composed of different kinds of metals being stacked upon one another. For example, the electrically conductive layer 40M may be a layered structure in which a titanium layer as an underlying layer is deposited on the surface of the second glass portion 40B and an aluminum layer is deposited on the titanium layer. Materials other than those in the example described above may be employed as a material of the electrically conductive layer 40M.

Anodic bonding can be carried out by applying a potential (e.g. −500 volts to −1 kilovolt) lower than the potential of the second glass portion 40B to the first glass portion 40A, followed by heating at a temperature in a range of about 300° C. to 400° C. For anodic bonding, any appropriate technique may be employed, and various known techniques may be employed. As a result of the anodic bonding, the concentration of the alkali metal element in the first glass portion 40A is locally decreased in a region in contact with the electrically conductive layer 40M. In this example, the second glass portion 40B may be made of an alkaline glass, or made of a non-alkaline glass or a semiconductor (monocrystalline silicon, polycrystalline silicon, carbon nitride, etc.). The second glass portion 40B does not need to be light-transmissive. While the example in FIG. 3A illustrates that the electrically conductive layer 40M is disposed only at the bonding surface, the electrically conductive layer 40M may also be formed on a surface (inner surface) of the second glass portion 40B that defines the recess 40V. Specific examples of the method of producing the cap 40 will be described later.

According to one embodiment of the present disclosure, the light-transmitting portion (first glass portion 40A) of the cap 40 has a plate shape, so that the first glass portion 40A can easily have a smooth surface. Moreover, it is also possible to form an antireflection coating on a surface of the first glass portion 40A, prior to bonding. This allows an antireflection coating to be formed on the inner surface of the cap 40 with a high production yield, even if the cap 40 is reduced in size.

Figure 4A:
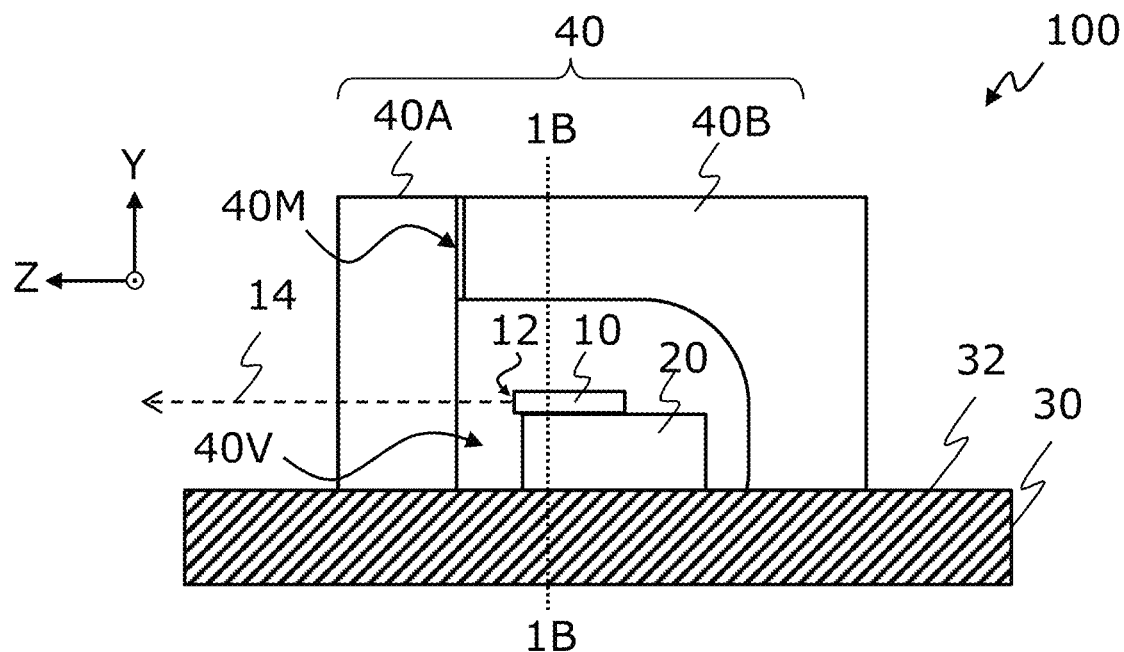
FIG. 4A is a cross-sectional view of a light source device according to another embodiment as taken parallel to the YZ plane.
Figure 4B:
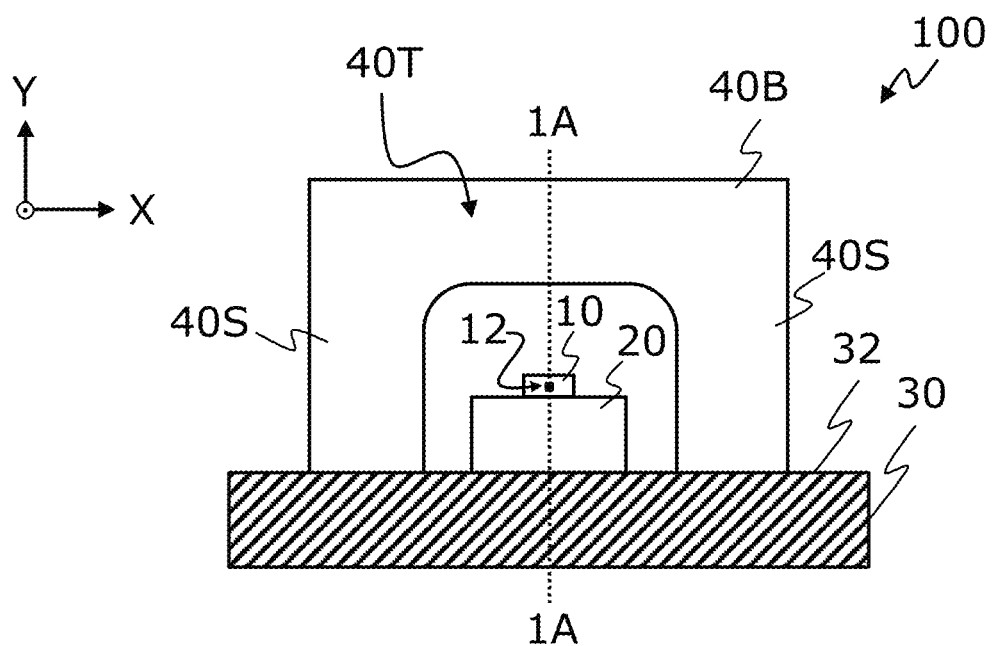
FIG. 4B is a cross-sectional view of a light source device according to another embodiment as taken parallel to the XY plane.

Any appropriate configurations other than those in the example illustrated in FIG. 3A and FIG. 3B may be employed for the cap 40 according to embodiments of the present disclosure. With reference to FIG. 4A and FIG. 4B, another example structure will be described. FIG. 4A is a cross-sectional view of the light source device 100 according to this example structure, as taken parallel to the YZ plane. FIG. 4B is a cross-sectional view taken along line 1B-1B in FIG. 4A. FIG. 4A corresponds to a cross-sectional view taken along line 1A-1A in FIG. 4B.

In the example shown in FIG. 4B and FIG. 4A, the second glass portion 40B of the cap 40 has a shape in which an inner wall surface includes a curved surface. Thus, the recess 40V of the cap 40 may have shapes other than a rectangular parallelepiped shape.

Figure 5A:
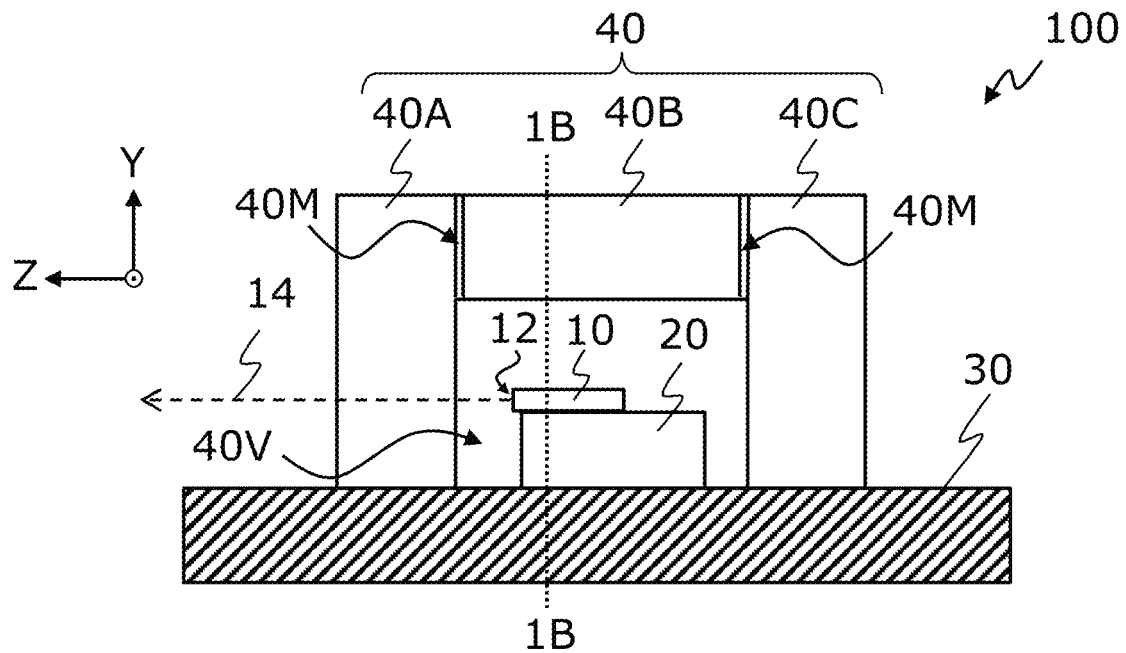
FIG. 5A is a cross-sectional view of a light source device according to still another embodiment as taken parallel to the YZ plane.
Figure 5B:
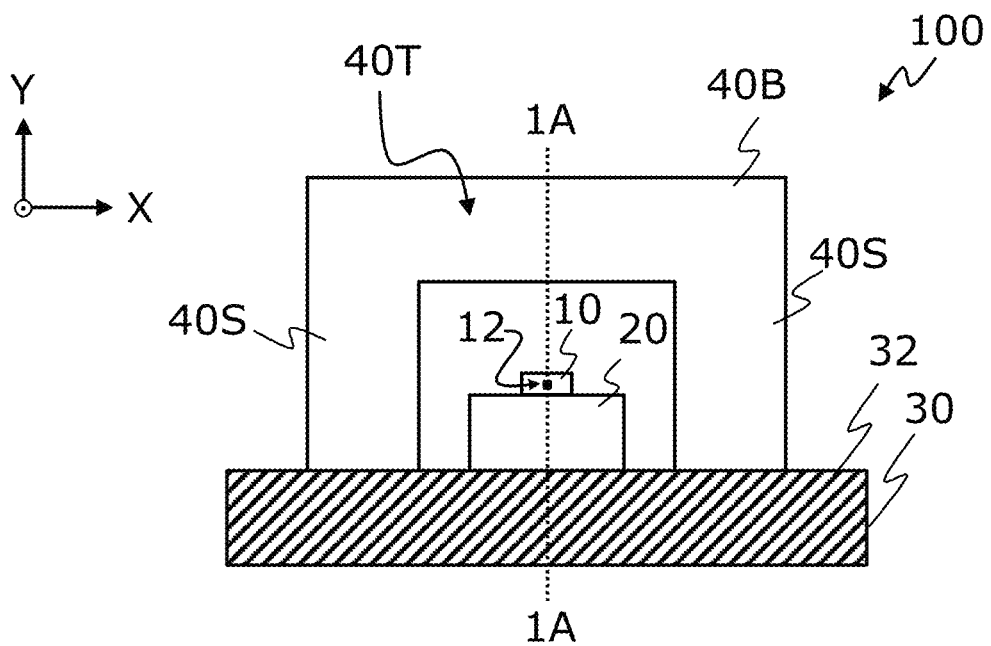
FIG. 5B is a cross-sectional view of a light source device according to still another embodiment as taken parallel to the XY plane.

Next, with reference to FIG. 5A and FIG. 5B, still another example structure will be described. FIG. 5A is a cross-sectional view of the light source device 100 according to this example structure, as taken parallel to the YZ plane. FIG. 5B is a cross-sectional view at line 1B-1B in FIG. 5A. FIG. 5A corresponds to a cross-sectional view taken along line 1A-1A in FIG. 5B.

In the example shown in FIG. 5B and FIG. 5A, the cap 40 includes a third glass portion 40C facing the first glass portion 40A, with the laser diode 10 disposed therebetween. As shown in FIG. 5A, the second glass portion 40B connects the first glass portion 40A and the third glass portion 40C together. The second glass portion 40B has a "C"-like shape, as shown in FIG. 5B. At least one of the second glass portion 40B and the third glass portion 40C is an alkaline glass. In certain embodiments, the third glass portion 40C may be an alkaline glass, and is anodically bonded to an electrically conductive layer 40M disposed on the surface of the second glass portion 40B. As a result of the anodic bonding, the concentration of the alkali metal element in the third glass portion 40C is locally decreased in a region in contact with the electrically conductive layer 40M. The second glass portion 40B may be made of an alkaline glass, with each of the first glass portion 40A and the third glass portion 40C made of a non-alkaline glass. Alternatively, each of the first to third glass portions 40A to 40C may be made of an alkaline glass.

Figure 6:
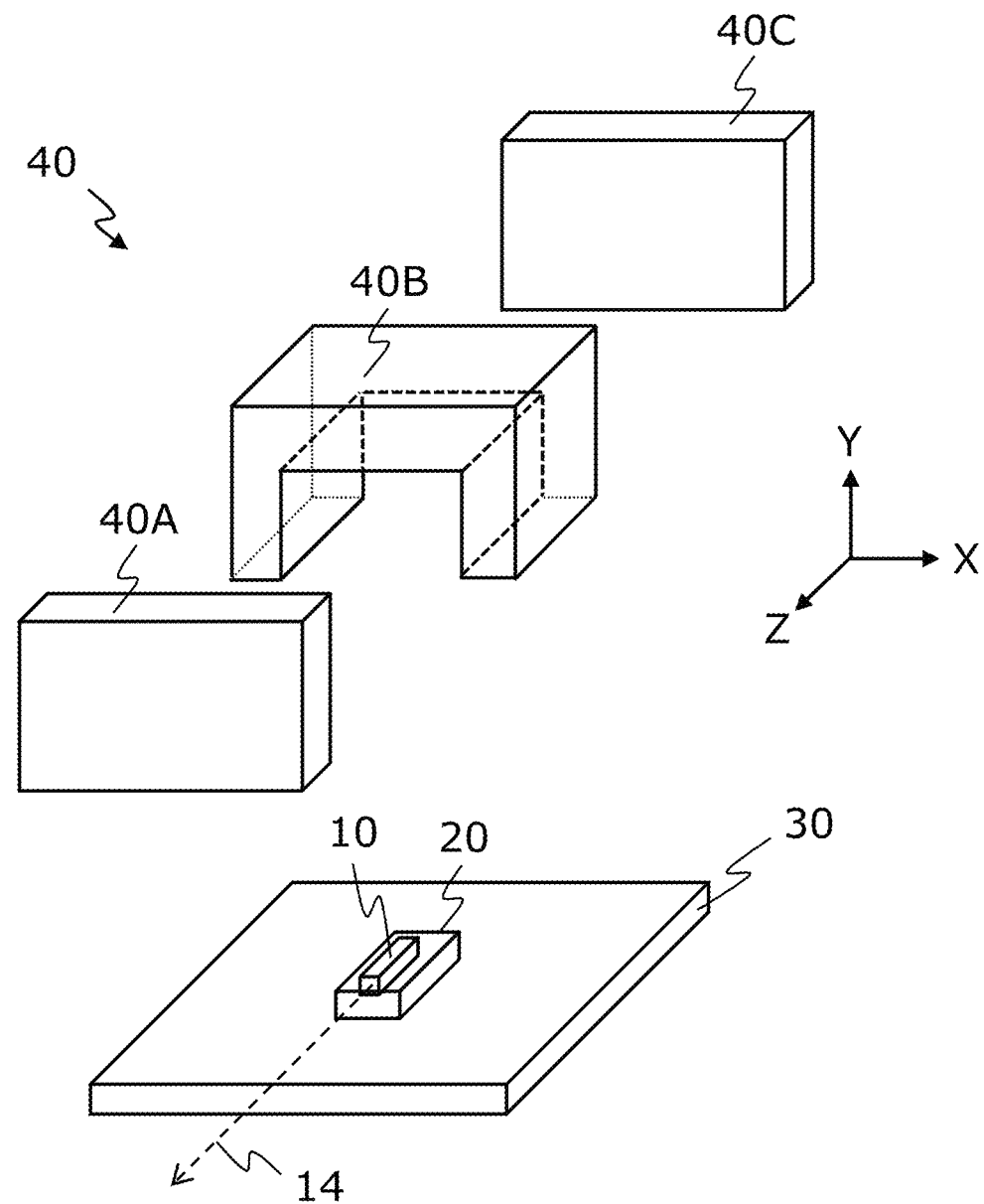
FIG. 6 is an exploded perspective view of a glass cap according to the embodiment shown in FIG. 5A.

As illustrated in FIG. 6, the cap 40 shown in FIG. 5A and FIG. 5B has a structure in which the first glass portion 40A and the third glass portion 40C are disposed on two opposite sides of the second glass portion 40B and are bonded to the second glass portion 40B. The second glass portion 40B that has been described with reference to FIGS. 3A through 4B corresponds to a structure in which the second glass portion 40B and the third glass portion 40C shown in FIG. 5A are monolithically formed and made of the same glass material.

Figure 7:
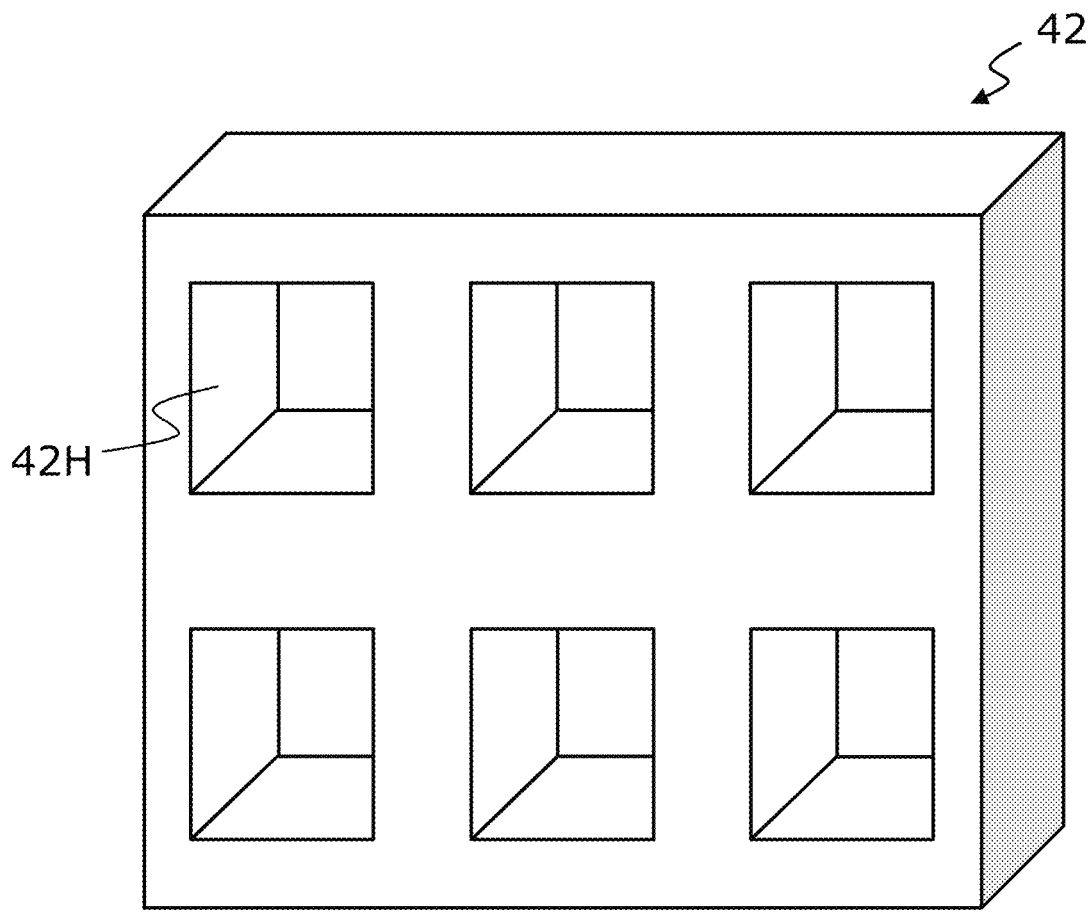
FIG. 7 is a perspective view showing an example of a plate including a plurality of second glass portions.
Figure 8:
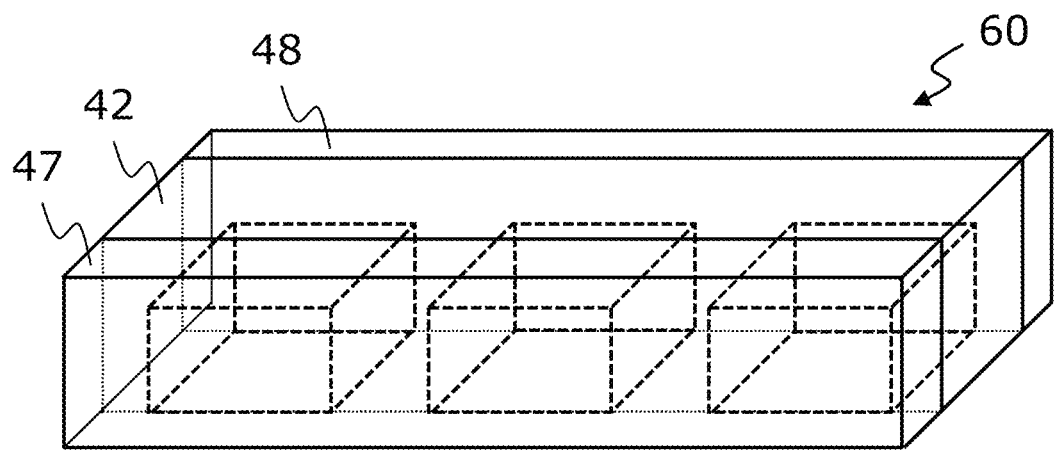
FIG. 8 is a perspective view of a bar before singulated into a plurality of glass caps.

FIG. 7 is a perspective view schematically showing an example of a plate 42 from which a plurality of second glass portions 40B (see FIG. 6) will be formed. The plate 42 has six through holes 42H that are arranged in two rows and three columns. The through holes 42H are closed with two glass sheets 47 and 48 on two opposite sides of the plate 42, so that a single panel can be obtained. The panel is divided along the lateral direction in FIG. 7 to obtain bars 60 (one of which is shown in FIG. 8). Three caps can be produced from such a single bar 60.

Hereinafter, one embodiment of a method of efficiently producing a multitude of caps 40 will be described in more detail.

Figure 9:
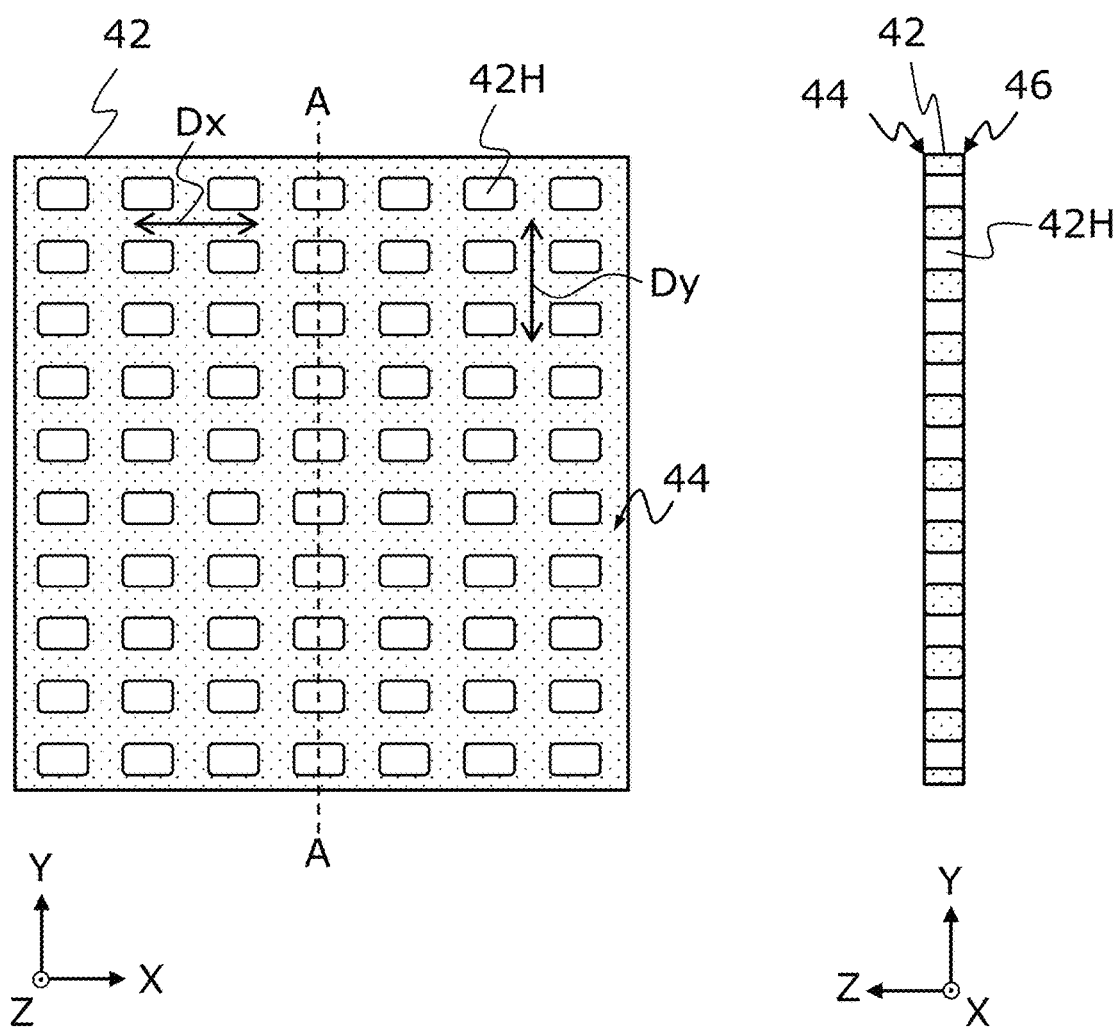
FIG. 9 is a diagram schematically showing an upper surface (on the left) and a cross section along line A-A (on the right) of a plate.

First, see FIG. 9. FIG. 9 is a diagram schematically showing an upper surface (on the left) and a cross section taken along line A-A (on the right) of the plate 42. The plate 42 has a first surface (upper surface) 44 and a second surface (lower surface) 46 opposite to the first surface 44. As shown in the drawing, the plate 42 has a plurality of through holes 42H that are arranged in a two-dimensional array along a first direction Dx and along a second direction Dy intersecting the first direction Dx, the first direction Dx and the second direction Dy extending in the first surface 44. The through holes 42H extend through the first surface 44 and the second surface 46. In this example, the first direction Dx is parallel to the X axis, and the second direction Dy is parallel to the Y axis. Each through hole 42H extends along the Z axis direction.

The through holes 42H can be formed by providing a glass or semiconductor substrate (thickness: e.g. 0.5 to 4 mm), and processing this substrate, for example. Examples of processing include formation of a mask pattern, sandblasting, etching, and the like. Using such processing techniques, instead of forming through holes 42H that extend through the first surface 44 and the second surface 46, depressions 42R that are recessed from the first surface 44 toward the second surface 46 can be formed. In the example shown in FIG. 10, after covering the first surface 44 of the plate 42 with a mask 45 having openings that determine the shapes and positions of the depressions 42R, exposed portions of the plate 42 are selectively removed through the openings of the mask 45. The plate 42 in FIG. 10 has a plurality of depressions 42R arranged in rows and columns. The two-dimensional array of the plurality of depressions 42R includes a first linear array of depressions 42R arranged along the first direction and a second linear array of depressions 42R arranged along the first direction and adjacent to the first linear array of depressions 42R in the second direction. Increasing the depth of the depressions 42R would result in the through holes 42H. The sizes of the depressions 42R or through hole 42H along the X direction, the Y direction, and the Z direction may be, respectively, 1 to 5 mm, 2 to 5 mm, and 0.5 to 4 mm, for example.

Figure 11:
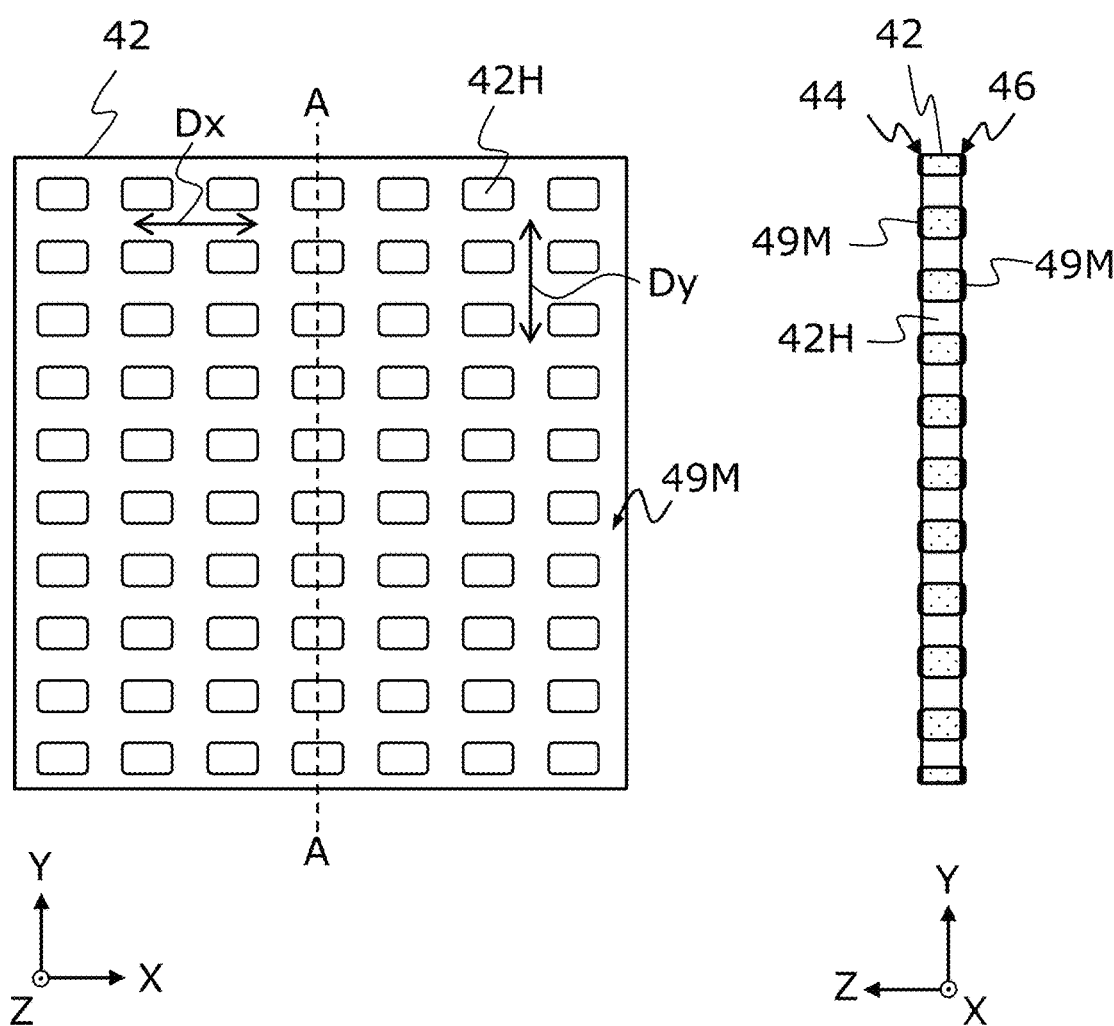
FIG. 11 is a diagram schematically showing an upper surface (on the left) and a cross section along line A-A (on the right) of a plate on which metal layers are disposed.
Figure 12:
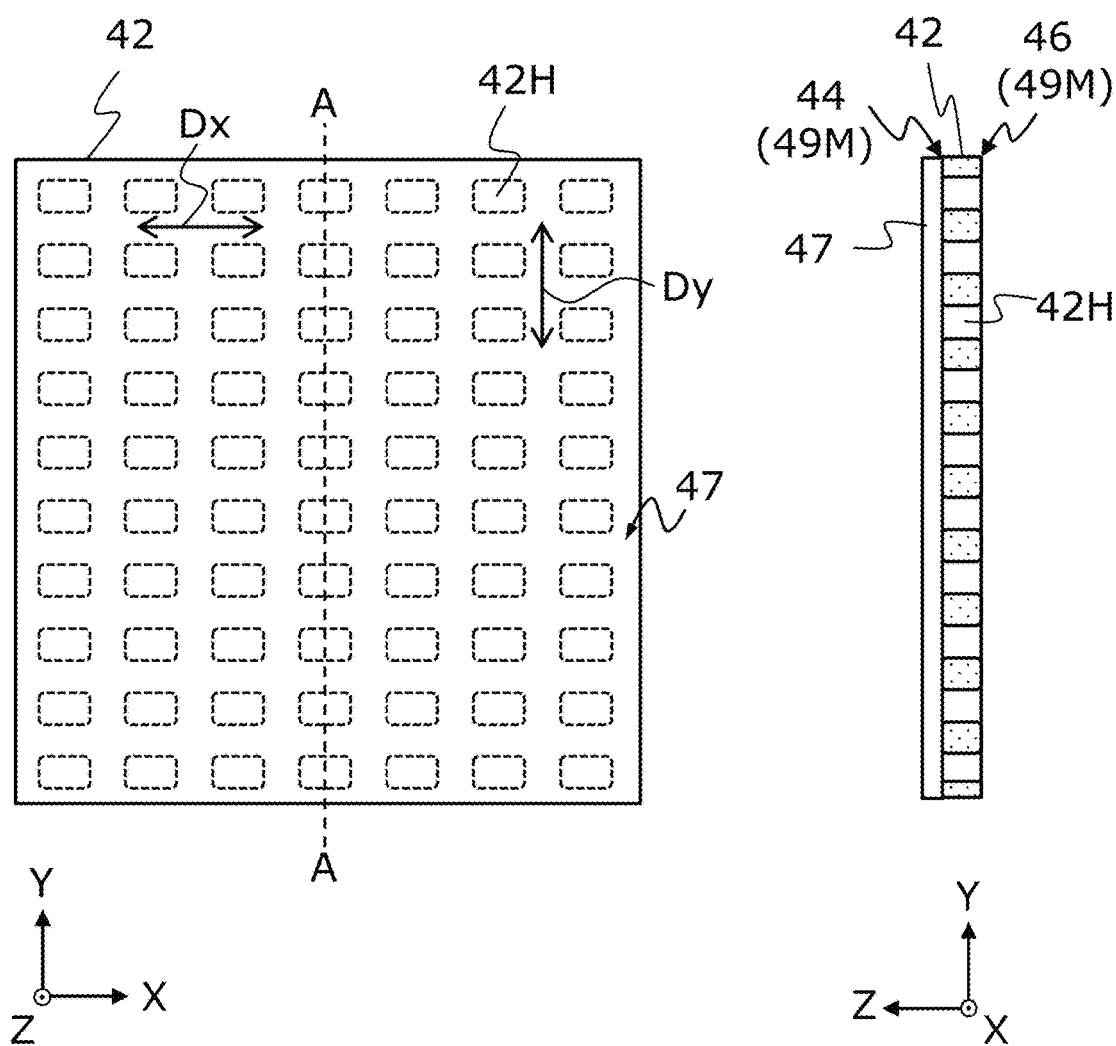
FIG. 12 is a diagram schematically showing an upper surface (on the left) and a cross section along line A-A (on the right) of a plate to which a first glass sheet is bonded.

Next, FIG. 11 will be described. FIG. 11 shows a metal layer 49M that has been deposited on the first surface 44 of the plate 42, in which the plurality of through holes 42H are defined. Thereafter, as shown in FIG. 12, a first glass sheet (thickness: e.g. 0.2 to 1.0 mm) 47 is bonded to the first surface 44 of the plate 42, on which the metal layer 49M is formed. Typical examples of the metal layer 49M may include a layer of aluminum (thickness: e.g. 50 to 1000 nm). The metal layer 49M may be made of a metal other than aluminum, e.g., titanium. The bonding may be performed using anodic bonding as described above. Thereafter, an antireflection coating may be disposed on the inner surface of the first glass sheet 47, from the second surface 46 through the through holes 42H. The inner surface of the first glass sheet 47 corresponds to the inner surface of the frontal portion 40F of the cap 40 shown in FIG. 1B. According to the present embodiment, an antireflection coating can be easily formed inside the cap 40 by using a thin-film deposition technique such as sputtering, for example.

Figure 13A:
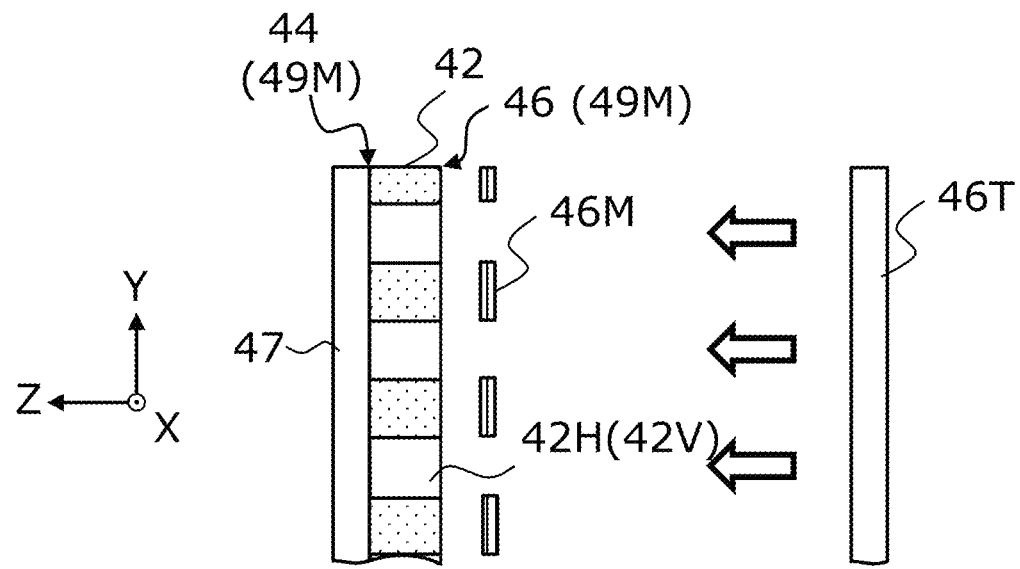
FIG. 13A is a cross-sectional view schematically showing forming of an antireflection coating.
Figure 13B:
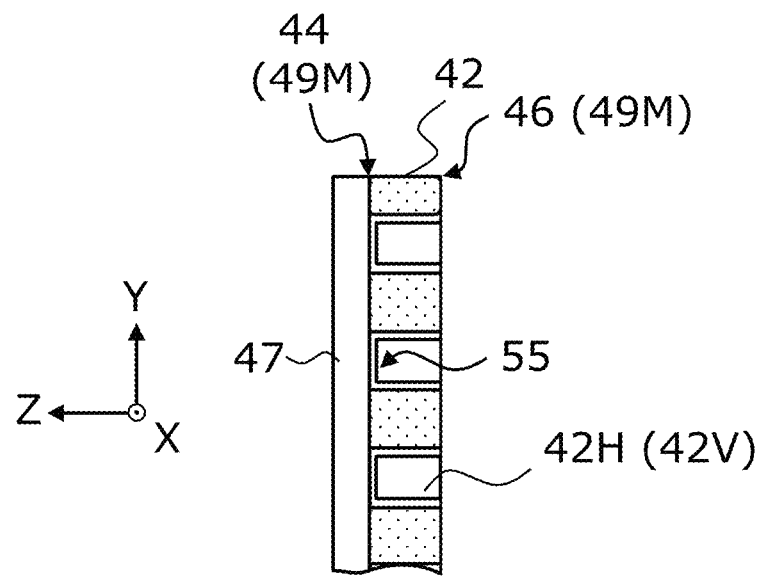
FIG. 13B is a cross-sectional view schematically showing forming of an antireflection coating.

FIG. 13A and FIG. 13B are cross-sectional views schematically showing steps for forming an antireflection coating. In this example, as shown in FIG. 13A, a target 46T of a material to compose the antireflection coating is disposed at a side of the plate 42 opposite to the second surface 46 of the plate 42. More specifically, the plate 42 is placed in a deposition chamber of a sputtering apparatus, for example. A mask 46M is disposed between the plate 42 and the target 46T. The mask 46M has openings of sizes and positions corresponding to the through holes 42H of the plate 42. By sputtering the target 46T with a plasma, the target material will be deposited on the inner walls of the through holes 42H and the exposed surface of the first glass sheet 47, through the openings of the mask 46M. Accordingly, as shown in FIG. 13B, an antireflection coating 55 is disposed.

The antireflection coating 55 may be disposed using other techniques. After covering regions of the second surface 46 of the plate 42 other than the through holes 42H with a mask, the antireflection coating 55 may be disposed from a vapor phase or a liquid phase using an alternative thin-film deposition technique. In this case, after the antireflection coating 55 is formed, the mask is removed. In the case in which the plate 42 has depressions 42R instead of through holes 42H, a pattern corresponding to the antireflection coating 55 may be formed on the first glass sheet 47 prior to bonding.

Figure 13C:
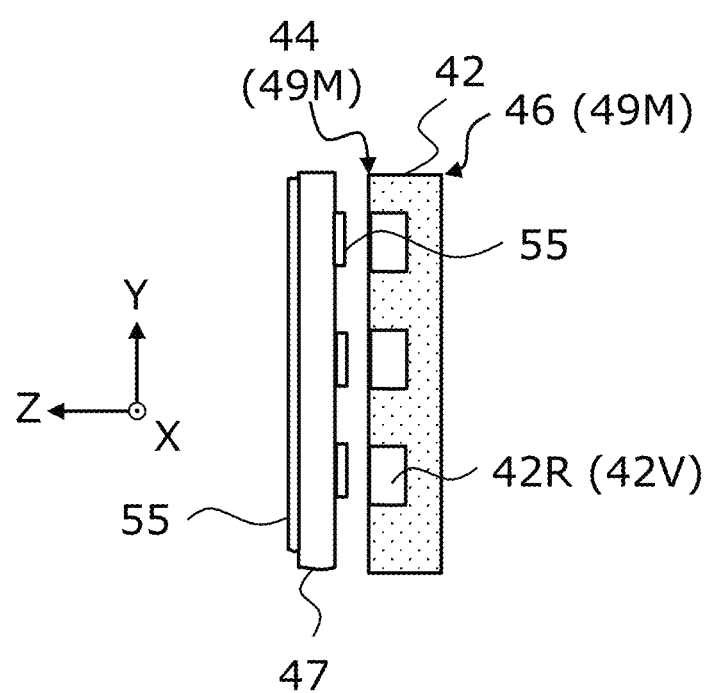
FIG. 13C is a cross-sectional view schematically showing forming of an antireflection coating.

FIG. 13C is a cross-sectional view schematically showing bonding the first glass sheet 47, on which the antireflection coating 55 of a predetermined pattern is formed, to the first surface 44 of the plate 42. The first glass sheet 47 is provided with the antireflection coating 55, which has been patterned so as to have shapes and sizes corresponding to the plurality of depressions 42R, on a surface of the first glass sheet 47. In the illustrated example, an additional single continuous antireflection coating 55 with a uniform thickness is also formed on a front surface of the first glass sheet 47. The first glass sheet 47 with an antireflection coating disposed on its front side may also be employed in the method that has been described with reference to FIG. 13A and FIG. 13B. Formation of the antireflection coating on the front side of the first glass sheet 47 may be performed subsequently to completion of the anodic bonding.

Figure 14:
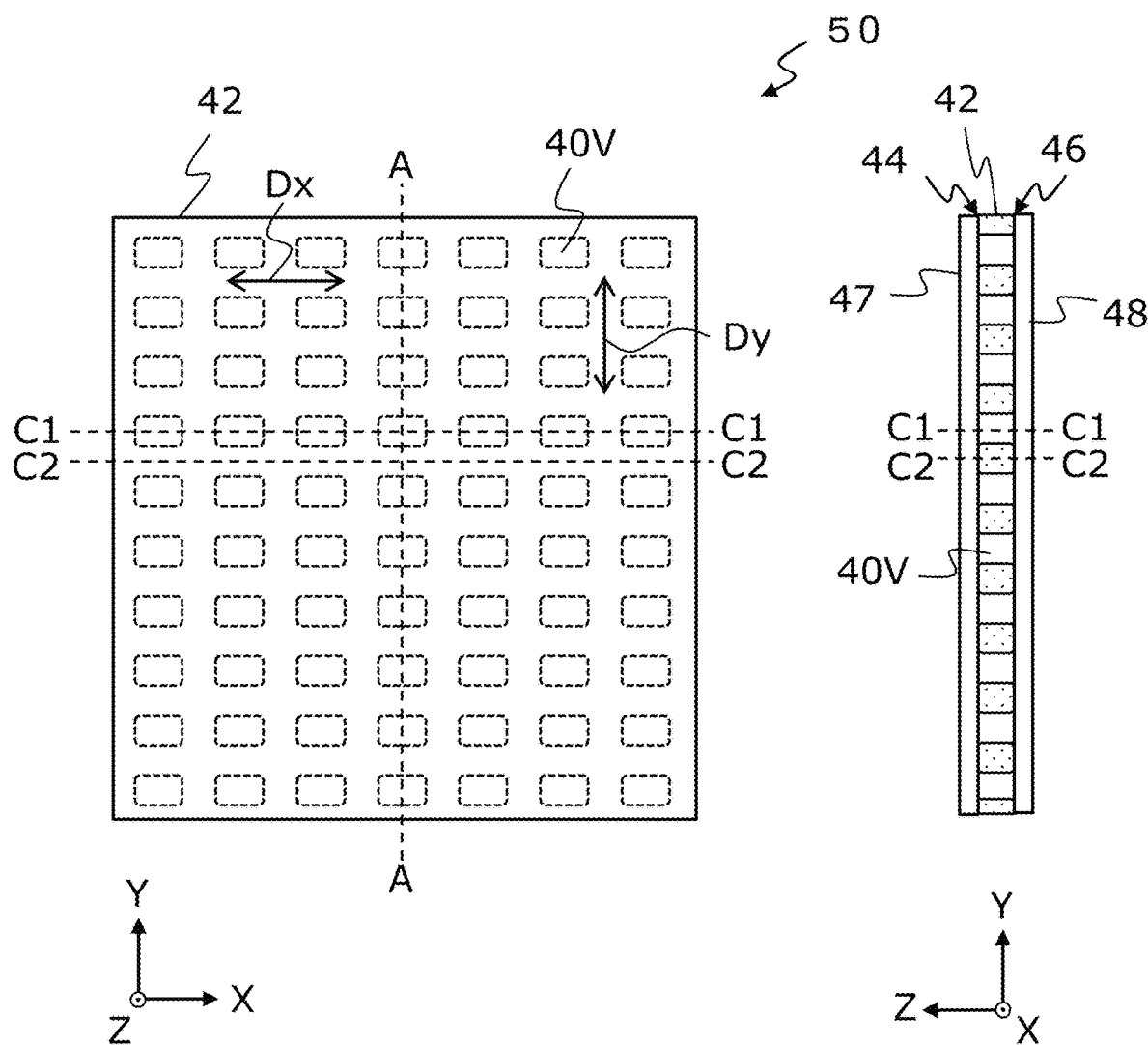
FIG. 14 is a diagram schematically showing an upper surface (on the left) and a cross section along line A-A (on the right) of a panel.

Next, anodic bonding is performed under conditions similar to the anodic bonding conditions described above, so that a second glass sheet (thickness: e.g. 0.2 to 1.0 mm) 48 is bonded onto the second surface 46 of the plate 42, on which the metal layer 49M is formed. In this manner, a panel 50 having a plurality of recesses 40V as shown in FIG. 14 is obtained. For simplicity, the antireflection coating 55 is omitted from illustration. In the case in which the plate 42 is made of a semiconductor, e.g., silicon, for example, the metal layer 49M is not needed.

Next, the panel 50 is cut along the first direction Dx. More specifically, the panel 50 is cut in order to divide the panel 50 into a plurality of bars 60 such that a first cutting plane C1 extends across a first linear array of through holes (recesses 40V) arranged along the first direction Dx and that a second cutting plane C2 parallel to the first cutting plane C1 extends across a region between the first linear array of through holes (recesses 40V) and a second linear array of through holes (recesses 40V) arranged along the first direction Dx and adjacent to the first linear array of through holes (recesses 40V) along the second direction Dy. Dividing may be performed by using a dicing saw, for example.

Figure 15:
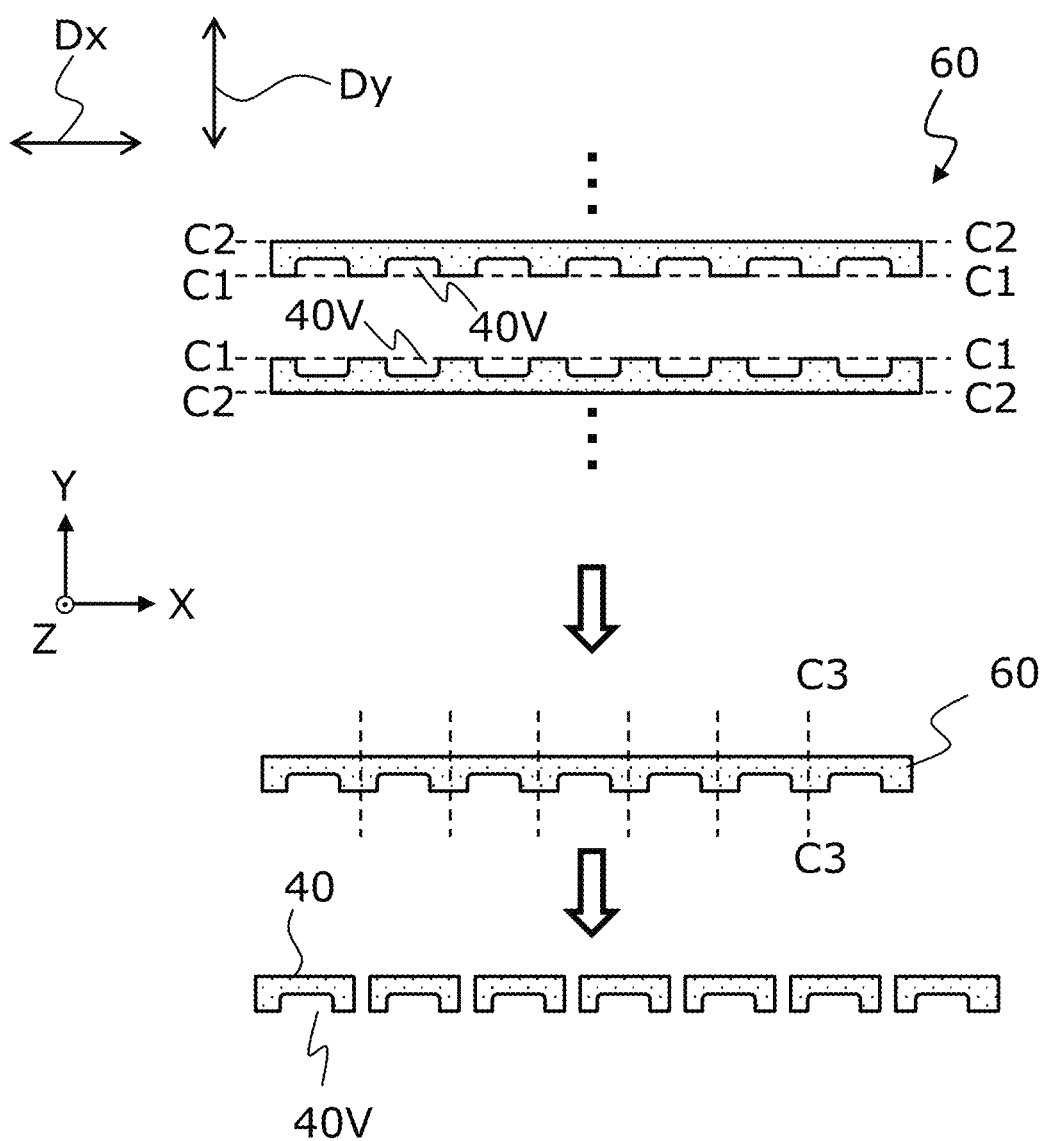
FIG. 15 is a diagram showing singulation from a bar into caps.

In the upper row of FIG. 15, two bars 60 that have been separated at the first cutting plane C1 are schematically shown. As shown in the lower drawing of FIG. 15, by cutting each bar 60 along the second direction Dy, in a region between adjacent through holes (recesses 40V) adjoining along the first direction Dx, a plurality of singulated caps 40 can be obtained from each bar 60. Each cap 40 is divided along a third cutting plane C3. The glass sheets 47 and 48 are not illustrated in FIG. 15. The lower end surface, the upper surface, and the lateral surfaces of each cap 40 are created by cutting along the cutting planes C1, C2 and C3, respectively, while surfaces of each cap 40 that are parallel to the plane shown in the drawing are defined by the glass sheets 47 and 48 (see FIG. 14). Surfaces created by cutting along the cutting planes C1, C2 and C3 may have irregularities that results from dicing or other processing. On the other hand, laser light will be transmitted through the smooth portion that is created from the first glass sheet 47, and therefore is free from adverse effects of the cut surfaces. Thus, according to the present embodiment, flatness and smoothness of the first glass sheet 47 are not degraded through the manufacturing, so that laser light is transmitted through a portion of the cap 40 that has good smoothness. In the case in which the surfaces created by cutting along the cutting planes C1, C2 and C3 have irregularities, irregularities may be flattened by polishing or the like. In particular, a bonding surface with the supporting substrate is preferably flat.

In this manner, a multitude of caps 40 each having a configuration shown in FIG. 5A and FIG. 5B can be produced. The first glass portion 40A and the third glass portion 40C of each cap 40 are made of, respectively, a portion of the first glass sheet 47 and a portion of the second glass sheet 48, while the second glass portion 40B is made of a portion of the plate 42. Moreover, each of the electrically conductive layers 40M is made of a corresponding portion of the metal layer 49M.

Figure 10:
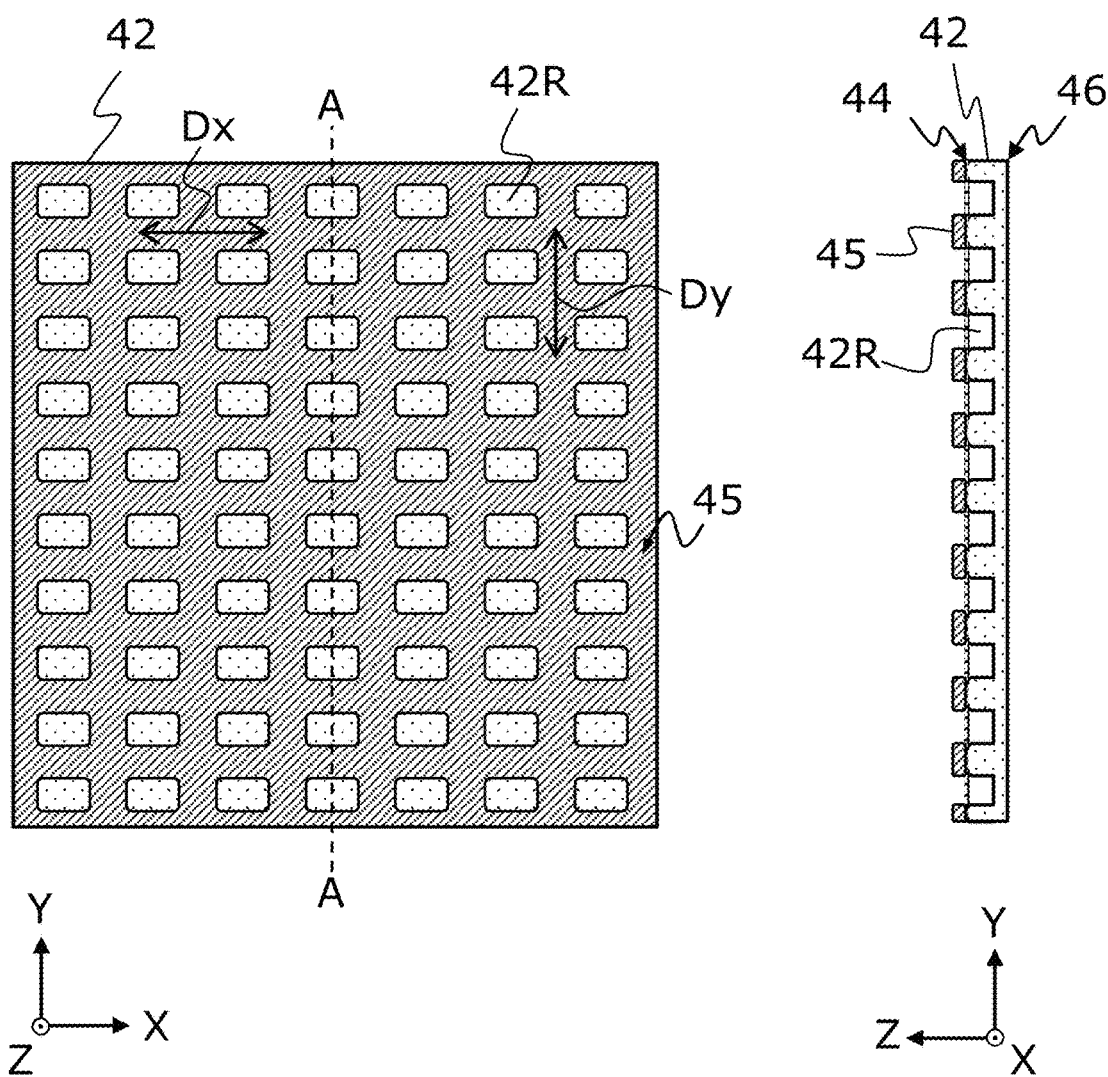
FIG. 10 is a diagram schematically showing an upper surface (on the left) and a cross section along line A-A (on the right) of a plate having a plurality of depressions arranged in rows and columns.

Using the plate 42 in the state shown in FIG. 10 allows for forming a multitude of caps 40 each having the configuration shown in FIG. 3A and FIG. 3B. In that case, the first glass portion 40A of each cap 40 is made of a portion of the first glass sheet 47, and the second glass portion 40B is made of a portion of the plate 42. The electrically conductive layer 40M is made of a portion of the metal layer 49M.

Using the cap 40 thus produced, the light source device 100 shown in FIG. 1A can be obtained.

According to one embodiment of the present disclosure, it is possible to mass-produce caps 40 having a height (size along the Y direction) of e.g. 2 millimeters or less. Moreover, an antireflection coating can be appropriately formed on the cap 40, so that transmittance of laser light can be enhanced, and stray light can be reduced.

Hereinafter, example modifications to the embodiment described above will be described.

While the embodiment described above illustrates a configuration in which at least one of the first glass portion 40A and the second glass portion 40B is an alkaline glass, it is not necessary for the entire first glass portion 40A or the entire second glass portion 40B to be an alkaline glass. More specifically, at least one of the first glass portion 40A and the second glass portion 40B may include an alkaline glass region, and the first glass portion 40A and the second glass portion 40B may be bonded together via an electrically conductive layer 40M that is in contact with that alkaline glass region included in the at least one of the first glass portion 40A and the second glass portion 40B.

In a configuration in which the cap 40 includes the third glass portion 40C facing the first glass portion 40A such that the laser diode 10 is disposed between the third glass portion 40C and the first glass portion 40A, and the second glass portion 40B connects the first glass portion 40A and the third glass portion 40C together, at least one of the second glass portion 40B and the third glass portion 40C may include an alkaline glass region, and the second glass portion 40B and the third glass portion 40C may be bonded together via an electrically conductive layer 40M that is in contact with that alkaline glass region.

Figure 16:
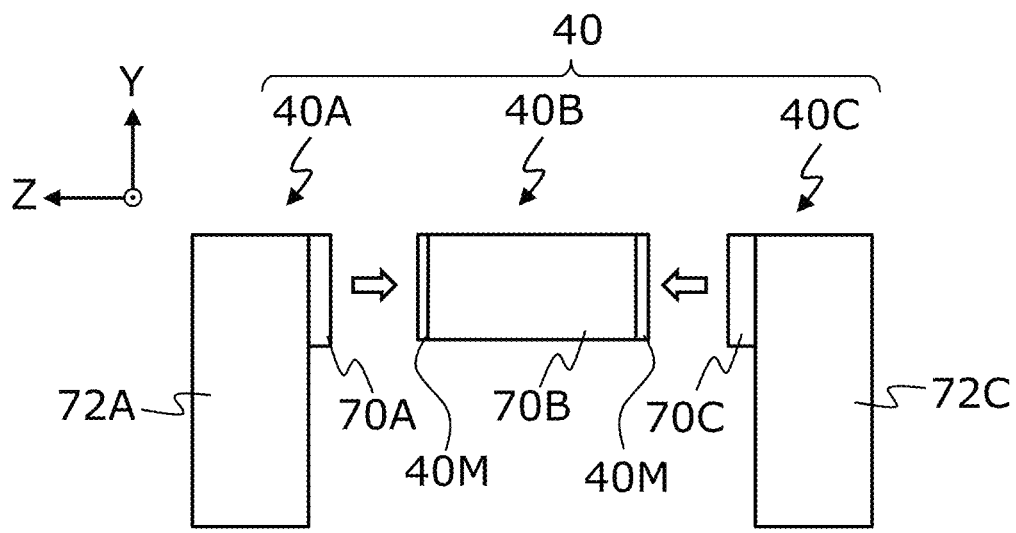
FIG. 16 is a cross-sectional view schematically showing an example structure of a cap according to a modified example.
Figure 17:
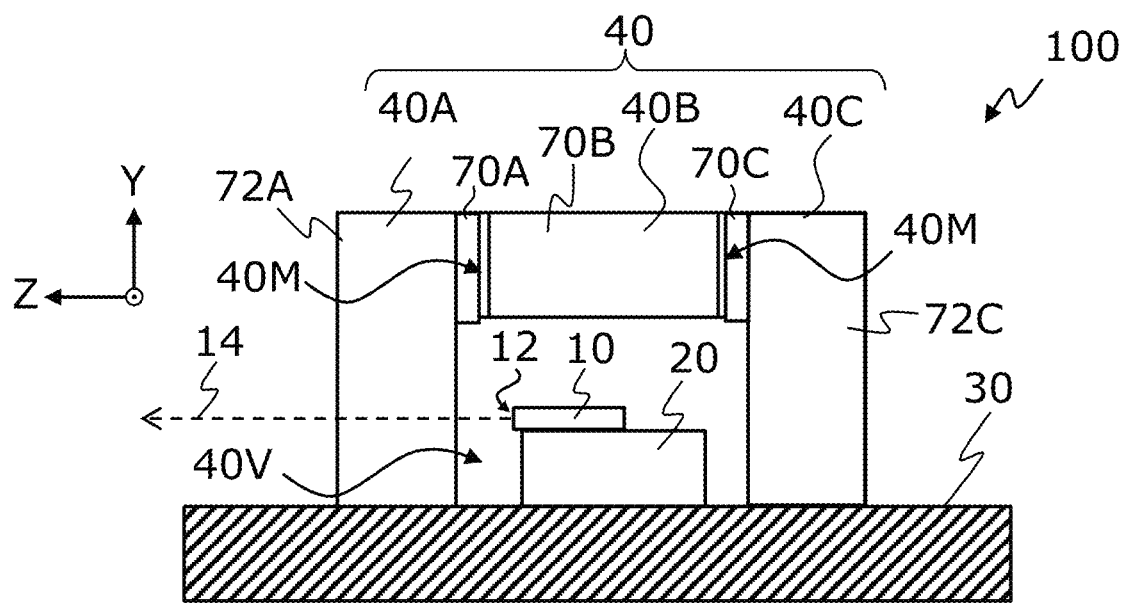
FIG. 17 is a cross-sectional view of a light source device including the cap in FIG. 16.

With reference to FIG. 16 and FIG. 17, a modified example of the present disclosure will be described. FIG. 16 is a cross-sectional view schematically showing an example structure of the cap 40 according to the modified example. FIG. 17 is a cross-sectional view of a light source device 100 including the cap 40 according to the modified example. The cap 40 shown in FIG. 16 includes a first glass portion 40A, a second glass portion 40B, and a third glass portion 40C. The first glass portion 40A includes an alkaline glass region 70A and a non-alkaline glass region 72A that is connected to the alkaline glass region 70A. The third glass portion 40C includes an alkaline glass region 70C and a non-alkaline glass region 72C that is connected to the alkaline glass region 70C. The second glass portion 40B in this example includes a non-alkaline glass region 70B, but does not include an alkaline glass region. Alternatively, the second glass portion 40B may include an alkaline glass region that is in contact with an electrically conductive layer 40M.

In the example of FIG. 16, the non-alkaline glass region 72A and the non-alkaline glass region 72C both have a thin plate shape. The alkaline glass region 70A and the alkaline glass region 70C are disposed at predetermined positions of the non-alkaline glass region 72A and the non-alkaline glass region 72C, respectively. A blank arrow on the left side of FIG. 16 schematically indicates that the alkaline glass region 70A of the first glass portion 40A is bonded to an electrically conductive layer 40M of the second glass portion 40B. Similarly, a blank arrow on the right side of FIG. 16 schematically indicates that the alkaline glass region 70C of the third glass portion 40C is bonded to an electrically conductive layer 40M of the second glass portion 40B. Such bonding is performed through the anodic bonding described above. In order to produce the cap 40 having such a structure, the alkaline glass region 70A may be provided in a region of the glass sheet 47 in FIG. 14 facing the first surface 44 of the plate 42. Similarly, the alkaline glass region 70C may be disposed in a region of the glass sheet 48 in FIG. 14 facing the second surface 46 of the plate 42. As can be seen from the left-hand side diagram in FIG. 14, the first surface 44 and the second surface 46 of the plate 42 have a lattice shape extending across the YX plane. Accordingly, it is desirable that the alkaline glass regions 70A and 70C also have a lattice shape extending across the YX plane on the glass sheets 47 and 48.

In order to produce the cap 40 through anodic bonding, it is sufficient that an alkaline glass region exists in a portion in contact with a metal layer used for anodic bonding, and it is not necessary that the entire glass portion located on either side of the metal layer used for anodic bonding is made of an alkaline glass.

Next, another modified example will be described with reference to FIG. 18 to FIG. 23.

Figure 18:
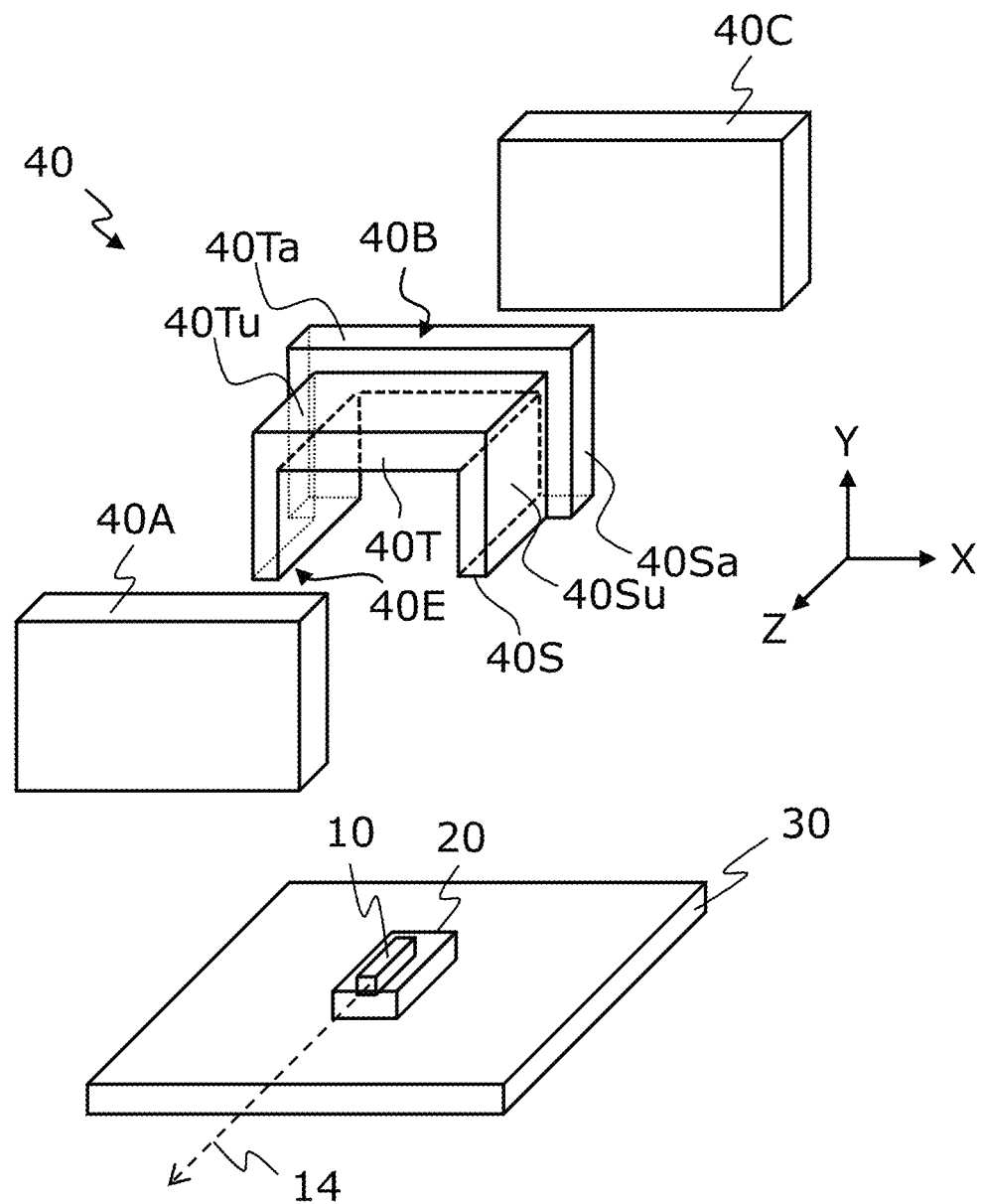
FIG. 18 is an exploded perspective view of a cap according to another modified example.
Figure 19:
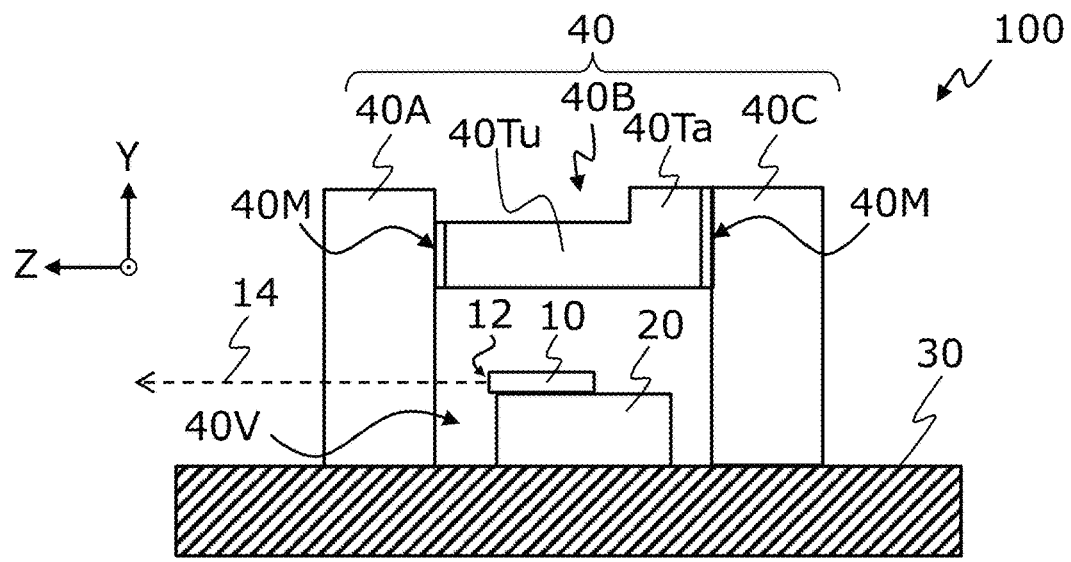
FIG. 19 is a cross-sectional view of the light source device according to one modified example shown in FIG. 18, as taken parallel to the YZ plane.

FIG. 18 and FIG. 19 will next be described. FIG. 18 is an exploded perspective view of the cap 40 according to this modified example. FIG. 19 is a cross-sectional view of the light source device 100 according to this modified example as taken parallel to the YZ plane.

In the modified example of FIG. 18, the second glass portion 40B of the cap 40 includes a thin portion 40Tu in the cover portion 40T and thin portions 40Su in the lateral wall portions 40S. More specifically, the second glass portion 40B includes: the thin portions 40Tu and 40Su; a thick portion 40Ta that has a thickness greater than a thickness of the thin portion 40Tu; and thick portions 40Sa that have a thickness greater than a thickness of the thin portions 40Su. A thickness of each of the thin portion 40Tu and the thick portion 40Ta refers to a size of a corresponding portion of the cover portion 40T along the Y axis direction. A thickness of each of the thin portions 40Su and A thickness of each of the thick portions 40Sa refer to sizes of respective corresponding portions of each lateral wall portion 40S along the X axis direction.

As shown in FIG. 19, the difference between a thickness of the thin portion 40Tu and a thickness of the thick portion 40Ta is, for example, 10 μm or greater and 200 μm or less. The difference between a thickness of the thin portions 40Su and a thickness of the thick portions 40Sa can be in a similar range. A method of forming the thin portions 40Tu and 40Su will be described below.

The cap 40 according to these modified examples can be produced generally using a method similar to the method that has been described with reference to FIG. 9 to FIG. 15, except that, prior to performing the anodic bonding, portions of the plate 42 are removed from the first surface (upper face) 44 of the plate 42 to form the thin portions 40Tu and 40Su.

Figure 20:
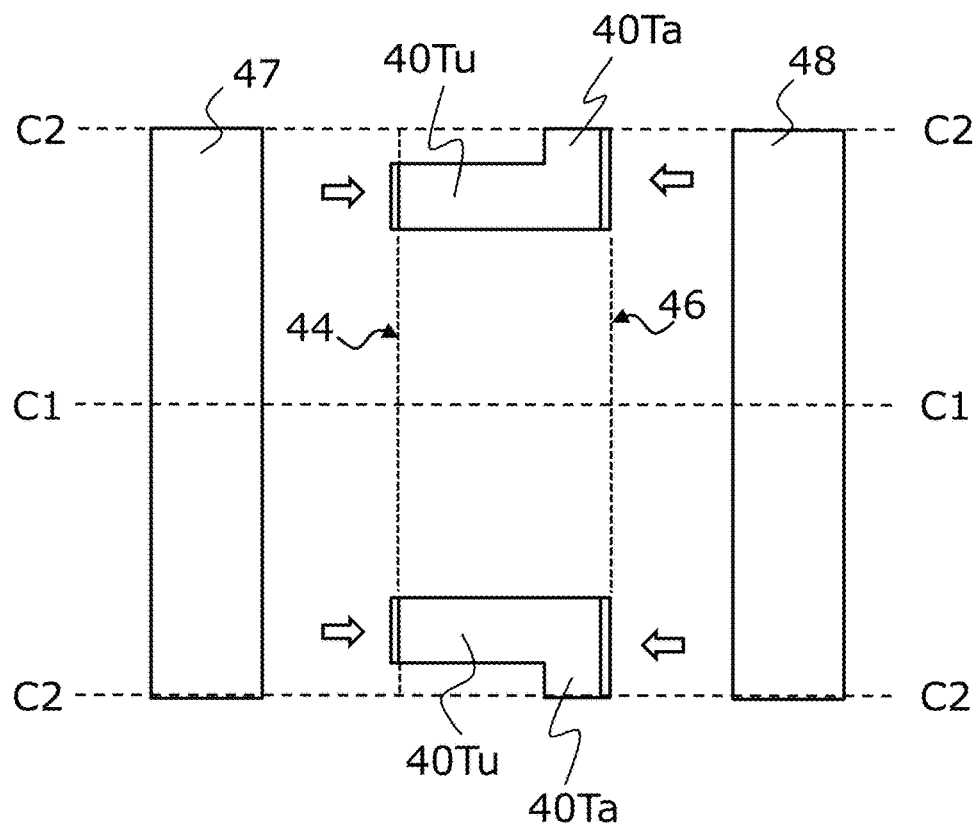
FIG. 20 is a diagram schematically showing a partial cross section of a plate 42 and glass sheets 47 and 48 prior to performing anodic bonding.

FIG. 20 is a diagram schematically showing a partial cross section of the plate 42 and the glass sheets 47 and 48 prior to performing anodic bonding. At the portions of the plate 42 where the through holes 42H are located, the first surface 44 and the second surface 46 are indicated as dotted lines. The thin portions 40Tu and 40Su may be formed by processing (half-dicing) the plate 42 using dicing technique, and forming a lattice-shaped grooves, which are shallower than the thickness of the plate 42, in the first surface 44 of the plate 42. The lattice-shaped grooves are formed to pass through the cutting planes used when the caps 40 are singulated. The lattice-shaped grooves can have a depth, i.e., size along the Z direction, of, for example, 30% or greater and 70% or less of a thickness of the plate 42. The groove formed by the half-dicing can have a width (i.e., size of each groove along the Y direction or the X direction) in a range of, for example, 50 μm to 3 mm.

Figure 21:
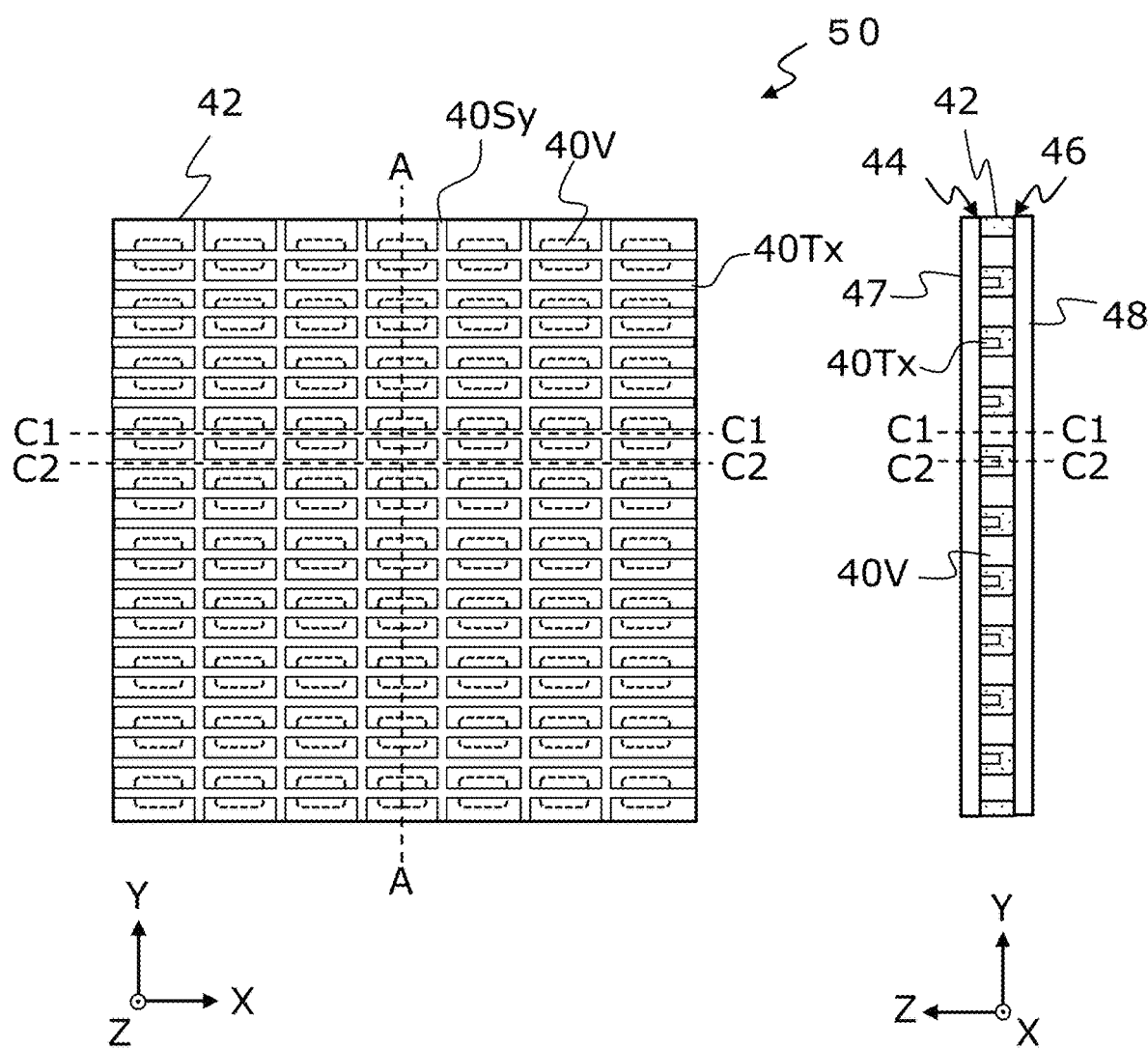
FIG. 21 is a diagram schematically showing an upper surface (on the left) and a cross section along line A-A (on the right) of a plate on which a lattice of grooves defining recesses are formed.

FIG. 21 shows the glass sheets 47 and 48 that have been bonded to the plate 42 in which the lattice-shaped grooves are formed. The lattice-shaped grooves that have been formed through a half-dicing include a plurality of first grooves 40Tx extending along the X axis direction and a plurality of second grooves 40Sy extending along the Y axis direction. By dividing the panel 50 in FIG. 21 produced through anodic bonding, the cap 40 according to this modified example can be obtained. The method for dividing the panel 50 may be similar to that in the method described with reference to FIG. 15.

According to this modified example, when the panel 50 is divided, the lattice-shaped grooves defining the first and second grooves 40Tx and 40Sy exist along the splitting lines. At portions with the first and second grooves 40Tx and 40Sy, a thickness of the plate 42 is reduced, which facilitates cutting. Therefore, when the panel 50 is divided by dicing or the like, breaking or chipping of the panel 50 can be reduced. As a result, the shape of each individual cap 40 is not degraded, so that the percentage of non-defective products, that is production yield is improved.

Figure 22:
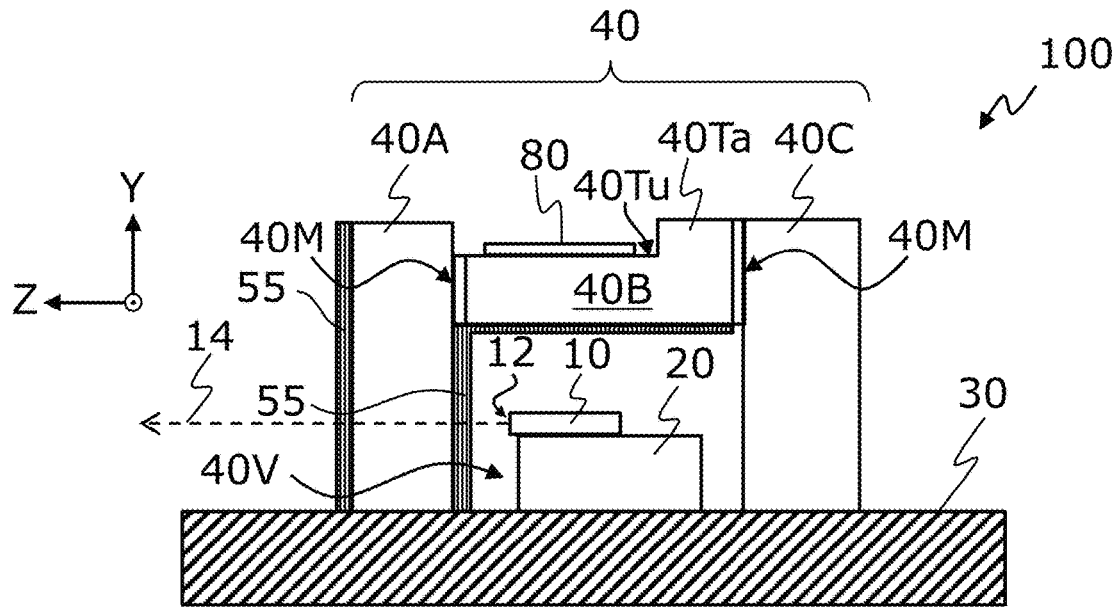
FIG. 22 is a cross-sectional view schematically showing an example structure of a light source device in which a patterned metal layer is disposed on the cap.

FIG. 22 is a cross-sectional view schematically showing an example structure of a light source device 100 in which a patterned metal layer (a metal layer pattern) 80 is disposed on the upper surface of the cap 40, more specifically, on the surface of the thin portion 40Tu, using the thin portion 40Tu of the cap 40. The metal layer 80 contains a pattern that is visually identifiable to humans, e.g., text characters, diagrams, and/or symbols, or a pattern that is decodable to electric machines, e.g., a bar code. These patterns may contain identification information that is assigned to each individual light source device 100, information concerning the production lot, an alignment pattern, a clock pattern, or various other information. The patterned metal layer 80 may function as, for example, an optical mark such as a linear bar code, a 2D bar code, or a Data Matrix code.

In a certain embodiment, the metal layer 80 may be deposited at the same time as depositing a corresponding one of the electrically conductive layers 40M used for anodic bonding onto the second glass portion 40B of the cap 40. The metal layer 80 thus deposited has a layer structure that is identical to the layer structure of the electrically conductive layer 40M. Patterning of the metal layer 80 may be conducted using lift-off technique, or a laser marking technique or an etching technique. Depositing the electrically conductive layer 40M and the metal layer 80 in the same step allows for efficiently forming marks including identification information. While the example of FIG. 22 illustrates the metal layer 80 being deposited on the surface of the thin portion 40Tu and thus being formed on the upper surface of the cap 40, the metal layer 80 may be disposed on the other thin portions 40Su. Disposing the metal layer 80 on the bottom surface of a recessed portion of the cap 40 allows for preventing forming an unnecessary protrusion by the metal layer 80, thus allowing the outer periphery of the cap 40 to be located within a predetermined accommodation space.

Figure 24:
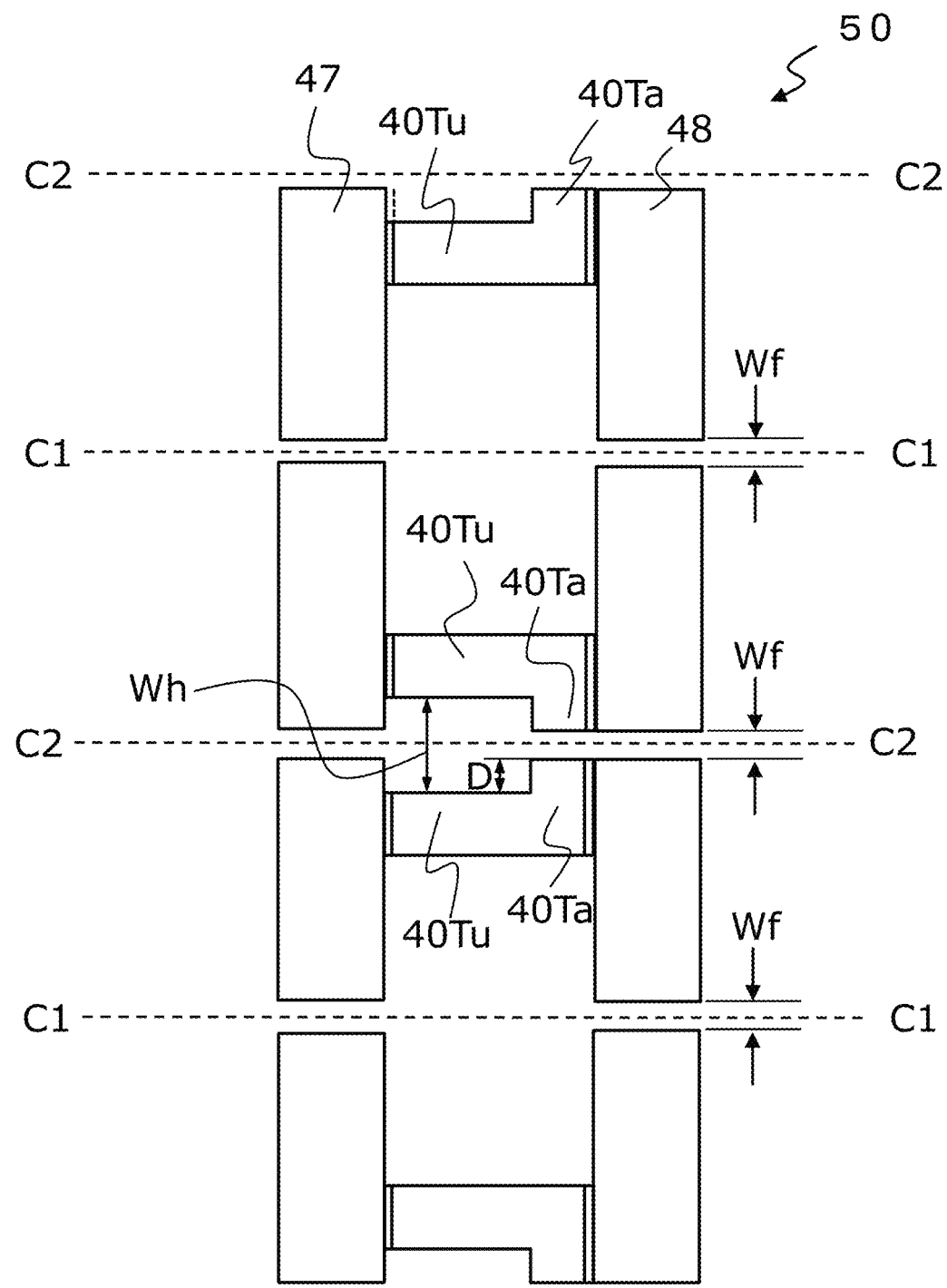
FIG. 24 is a cross-sectional view schematically showing a depth D of a dent relative to the surface of a thin portion 40Tu serving as a bottom of the dent, a width Wh of grooves to be formed through half-dicing, and a cut width Wf resulting from fully-cutting a panel 50 apart.

The recessed portion formed with a surface of the thin portion 40Tu and 40Su serving as a bottom of the recessed portion has a depth D narrower than a half of a width Wh of the grooves to be formed by the half-dicing described above. More specifically, given a cut width Wf resulting from fully-cutting the plate 42 apart, a relationship D=(Wh−Wf)/2 can be approximately satisfied. For example, the depth D is in a range of about 10 to 200 μm. Therefore, the recessed portion of the cap 40 where the metal layer 80 is disposed can be obtained by setting the width Wh of the grooves formed through half-dicing to be greater than the cut width made in the plate 42 when cutting along the second cutting plane C2, for example. FIG. 24 is a cross-sectional view schematically showing the depth D of the recessed portion formed with the surface of the thin portion 40Tu serving as a bottom of the recessed portion, the width Wh of grooves formed through half-dicing, and the cut width Wf when the panel 50 is fully cut apart. In the case in which the cutting planes C1 and C2 for the full-cut are formed using a blade, for example, the cut width Wf corresponds to the blade width.

In FIG. 21, the groove width of the first grooves 40Tx through which the first cutting plane C1 extends and the groove width of the first grooves 40Tx through which the second cutting plane C2 extends are represented in the same size. The groove width of the first grooves 40Tx through which the first cutting plane C1 extends is preferably equal to or less than the cut width resulting from dividing of the panel 50. The first cutting plane C1 is a surface defining the lower end surface 40E of the cap 40 (see FIG. 15). As shown in FIG. 18, the lower end surface 40E of the cap 40 is bonded to the principal surface 32 of the substrate 30, and accordingly is preferably flat. Therefore, when performing half-dicing to form the first grooves 40Tx at cut surfaces created by cutting along the first cutting plane C1, the groove width Wh resulting from the half-dicing is preferably equal to or less than the cut width Wf resulting from fully-cutting the plate 42 apart. Even if irregularities resulting from half-dicing exists on the cut surfaces created by cutting along the first cutting plane C1, the cut surfaces may be flattened by performing polishing or the like after the cutting.

Figure 23:
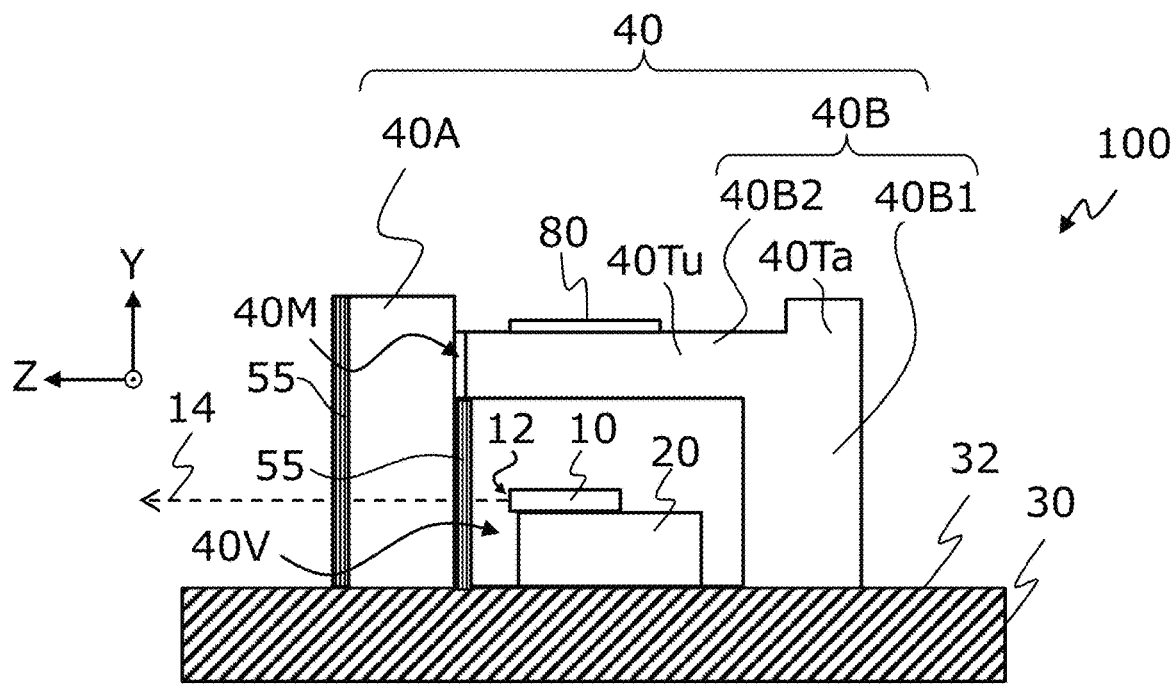
FIG. 23 is a cross-sectional view schematically showing another example structure of a light source device in which a patterned metal layer is disposed on the cap.

FIG. 23 is a cross-sectional view schematically showing another example structure of the light source device 100, in which a patterned metal layer 80 is disposed on the thin portion 40Tu of the cap 40. In this example, the cap 40 is obtained by, after producing the plate 42 using the method described with reference to FIG. 10, forming a lattice-shaped grooves defining the thin portions 40Tu and 40Su on the plate 42.

Each of FIG. 22 and FIG. 23 shows the antireflection coating 55 formed on the first glass portion 40A of the cap 40. In these examples, the antireflection coating 55 is formed not only inside, but also outside of the first glass portion 40A functioning as the frontal portion 40F of the cap 40. The antireflection coating 55 may be disposed on a location other than that in the illustrated examples.

A light source device according to certain embodiments of the present disclosure includes a cap including light-transmitting portion of good smoothness and being appropriate for downsizing, and therefore is preferably used as a small-sized light source for a head-mounted display or the like. A method of manufacturing a light source device according to certain embodiments of the present disclosure allows for an efficient mass production of such a cap, and therefore can reduce the production cost for a light source device that includes the laser diode.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:

1. A light source device comprising:
a laser diode;
a substrate directly or indirectly supporting the laser diode; and
a cap secured to the substrate and covering the laser diode, the cap comprising:
a first glass portion configured to transmit laser light that is emitted from the laser diode, and
a second glass portion; wherein:
the first glass portion is made of an alkaline glass;
the first glass portion and the second glass portion are bonded together via an electrically conductive layer that is in contact with the alkaline glass;
the first glass portion is bonded to the substrate; and
a concentration of an alkali metal element in the first glass portion is locally decreased in a region in contact with the electrically conductive layer.

2. The light source device according to claim 1, wherein:
the second glass portion of the cap comprises a thin portion and a thick portion that has a thickness greater than a thickness of the thin portion; and
the cap comprises a metal layer pattern on a surface of the thin portion.

3. The light source device according to claim 2, wherein:
the metal layer pattern is a bar code or a Data Matrix code.

4. A light source device comprising:
a laser diode;
a substrate directly or indirectly supporting the laser diode; and
a cap secured to the substrate and covering the laser diode, the cap comprising:
a first glass portion configured to transmit laser light that is emitted from the laser diode, and
a second glass portion; wherein:
the first glass portion comprises an alkaline glass region and a non-alkaline glass region that is connected to the alkaline glass region;
the first glass portion and the second glass portion are bonded together via an electrically conductive layer that is in contact with the alkaline glass region; and
the first glass portion is bonded to the substrate.

5. The light source device according to claim 4, wherein:
the second glass portion of the cap comprises a thin portion and a thick portion that has a thickness greater than a thickness of the thin portion; and
the cap comprises a metal layer pattern on a surface of the thin portion.

6. The light source device according to claim 5, wherein:
the metal layer pattern is a bar code or a Data Matrix code.

7. A light source device comprising:
a substrate;
an edge-emission type laser diode having an end surface through which laser light is emitted, and being directly or indirectly mounted on the substrate so as to emit the laser light in a direction along the substrate; and
a cap secured to the substrate and covering the laser diode, the cap comprising:
a first glass portion configured to transmit the laser light that is emitted from the laser diode, and
a second glass portion, and
a third glass portion that faces the first glass portion with the laser diode disposed between the first glass portion and the third glass portion, wherein:
the second glass portion connects the first glass portion and the third glass portion together; wherein:
at least one of the first glass portion and the second glass portion comprises an alkaline glass region;
the first glass portion and the second glass portion are bonded together via an electrically conductive layer that is in contact with the alkaline glass region;
the first glass portion is bonded to the substrate;
the first glass portion is disposed at a position on the substrate such that the first glass portion intersects a path of the laser light
the second glass portion comprises:
a pair of lateral wall portions that are located at a lateral side of the laser diode, and
a cover portion that is located above the laser diode and connects the pair of lateral wall portions together.

8. The light source device according to claim 7, wherein:
at least one of the second glass portion and the third glass portion comprises an alkaline glass region; and
the second glass portion and the third glass portion are bonded together via an additional electrically conductive layer that is in contact with the alkaline glass region.

9. The light source device according to claim 8, wherein:
the third glass portion comprises the alkaline glass region and a non-alkaline glass region that is connected to the alkaline glass region.

10. The light source device according to claim 8, wherein:
the second glass portion comprises the alkaline glass region and a non-alkaline glass region that is connected to the alkaline glass region.

11. The light source device according to claim 7, wherein:
the second glass portion and the third glass portion are monolithically formed and made of a same glass material.

12. The light source device according to claim 7, wherein:
the second glass portion of the cap comprises a thin portion and a thick portion that has a thickness greater than a thickness of the thin portion; and
the cap comprises a metal layer pattern on a surface of the thin portion.

13. The light source device according to claim 12, wherein:
the metal layer pattern is a bar code or a Data Matrix code.

14. A method of manufacturing a light source device, comprising:
providing a substrate directly or indirectly supporting a laser diode;
providing a cap comprising a first portion configured to transmit laser light that is emitted from the laser diode, and a second portion, wherein at least one of the first portion and the second portion comprises an alkaline glass region, and wherein the first portion and the second portion are bonded together via an electrically conductive layer disposed in contact with the alkaline glass region; and
covering the laser diode with the cap and securing the cap to the substrate, wherein:
the step of providing the cap comprises:
providing a plate having a first surface and a second surface that is opposite to the first surface, the plate having a plurality of through holes arranged in a two-dimensional array along a first direction and along a second direction that intersects the first direction, the first direction and the second direction extending in the first surface, the plurality of through holes extending through the first surface and the second surface, the two-dimensional array comprising a first linear array of through holes arranged along the first direction and a second linear array of through holes arranged along the first direction and adjacent to the first linear array of through holes in the second direction,
disposing a metal layer on each of the first surface and the second surface of the plate,
bonding a first glass sheet to the first surface of the plate using anodic bonding, and bonding a second glass sheet to the second surface of the plate, to produce a panel having a plurality of recesses,
cutting the panel in the first direction along a first cutting plane and a second cutting plane parallel to the first cutting plane to obtain a plurality of bars, such that the first cutting plane extends across the first linear array of through holes and the second cutting plane extends across a region between the first linear array of through holes and the second linear array of through holes, and
cutting each of the plurality of bars along the second direction between adjacent ones of the through holes adjoining along the first direction to singulate the bar into a plurality of the caps,
the first portion is made of a portion of the first glass sheet;
the second portion is made of a portion of the plate; and
the electrically conductive layer is made of a portion of the metal layer.

15. The manufacturing method according to claim 14, wherein:
the plate is made of an alkaline glass; and
each of the first and second glass sheets is made of a non-alkaline glass.

16. The manufacturing method according to claim 14, wherein:
the plate is made of a non-alkaline glass or a semiconductor; and
each of the first and second glass sheets is made of an alkaline glass.

17. The manufacturing method according to claim 14, wherein:
the first glass sheet comprises the alkaline glass region and a non-alkaline glass region that is connected to the alkaline glass region; and
in the bonding of the first glass sheet to the first surface of the plate using the anodic bonding, the alkaline glass region of the first glass sheet is brought into contact with the metal layer.

18. The manufacturing method according to claim 14, wherein:
the step of providing the cap comprises, before the cutting of the panel to obtain the plurality of bars, performing a half-dicing to form a groove at a portion of the plate where the second cutting plane is to be created, the groove being shallower than a thickness of the plate; and a width of the groove is greater than a cut width made in the plate when cutting along the second cutting plane.

19. The manufacturing method according to claim 18, further comprising:

after the performing half-dicing, disposing a metal layer pattern on a surface of the groove formed in the plate.

20. A method of manufacturing a light source device, comprising:

providing a substrate directly or indirectly supporting a laser diode;

providing a cap comprising a first portion configured to transmit laser light that is emitted from the laser diode, and a second portion, wherein at least one of the first portion and the second portion comprises an alkaline glass region, and wherein the first portion and the second portion are bonded together via an electrically conductive layer disposed in contact with the alkaline glass region; and covering the laser diode with the cap and securing the cap to the substrate, wherein:

the step of providing the cap comprises:

providing a plate having a first surface and a second surface opposite to the first surface, the plate having a plurality of depressions arranged in a two-dimensional array along a first direction and along a second direction that intersects the first direction, the first direction and the second direction being in the first surface, the plurality of depressions recessed from the first surface toward the second surface, the two-dimensional array comprising a first linear array of depressions arranged along the first direction and a second linear array of depressions arranged along the first direction and adjacent to the first linear array of depressions in the second direction, disposing a metal layer on the first surface of the plate, bonding a glass sheet to the first surface of the plate using anodic bonding to produce a panel defining a plurality of recesses, cutting the panel in the first direction along a first cutting plane and a second cutting plane parallel to the first cutting plane to obtain a plurality of bars, such that the first cutting plane extends across the first linear array of depressions and the second cutting plane extends across a region between the first linear array of depressions and the second linear array of depressions, and cutting each of the plurality of bars along the second direction between adjacent ones of the depressions adjoining along the first direction to singulate the bar into a plurality of the caps;

the first portion is made of a portion of the glass sheet;

the second portion is made of a portion of the plate; and the electrically conductive layer is made of a portion of the metal layer.

* * * * *

UNITED STATES PATENT AND TRADEMARK OFFICE
CERTIFICATE OF CORRECTION

PATENT NO. : 11,539,182 B2
APPLICATION NO. : 17/021855
DATED : December 27, 2022
INVENTOR(S) : Tadaaki Miyata and Yoshihiro Kimura It is certified that error appears in the above-identified patent and that said Letters Patent is hereby corrected as shown below:

In the Claims

Claim 7, Column 15, Line 21:
Delete:
"path of the laser light"
Replace with:
"path of the laser light;"

Signed and Sealed this
Twenty-first Day of March, 2023

*Katherine Kelly Vidal*

Katherine Kelly Vidal
*Director of the United States Patent and Trademark Office*